(12) United States Patent
Ma et al.

(10) Patent No.: US 11,501,718 B2
(45) Date of Patent: Nov. 15, 2022

(54) DIGITAL-ANALOG CONVERTER, DATA DRIVING CIRCUIT HAVING THE SAME, AND DISPLAY DEVICE HAVING THE SAME

(71) Applicant: SAMSUNG DISPLAY CO., LTD., Yongin-si (KR)

(72) Inventors: Hyung Gun Ma, Yongin-si (KR); Oh Jo Kwon, Yongin-si (KR); Ji Woong Kim, Yongin-si (KR); Jun Yong Song, Yongin-si (KR); Seong Joo Lee, Yongin-si (KR); Sang Hyun Heo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/166,482

(22) Filed: Feb. 3, 2021

(65) Prior Publication Data

US 2022/0013070 A1 Jan. 13, 2022

(30) Foreign Application Priority Data

Jul. 10, 2020 (KR) .......................... 10-2020-0085697

(51) Int. Cl.
*G09G 3/3275* (2016.01)
*H03M 1/66* (2006.01)
*G09G 3/32* (2016.01)

(52) U.S. Cl.
CPC ............ *G09G 3/3275* (2013.01); *H03M 1/66* (2013.01); *G09G 3/32* (2013.01); *G09G 2310/027* (2013.01); *G09G 2310/0291* (2013.01); *G09G 2330/028* (2013.01)

(58) Field of Classification Search
CPC ..... G09G 3/32–3291; G09G 2310/027; G09G 2310/0291; G09G 2330/028; H03M 1/66
See application file for complete search history.

(56) References Cited

U.S. PATENT DOCUMENTS

| | | | | |
|---|---|---|---|---|
| 7,236,114 B2* | 6/2007 | Ahn | ..................... | G09G 3/3685 341/145 |
| 8,860,704 B2* | 10/2014 | Lee | .......................... | G09G 3/20 345/212 |
| 9,837,040 B2* | 12/2017 | Moon | .................. | G09G 3/2092 |
| 9,934,750 B2* | 4/2018 | Park | ..................... | G09G 3/3688 |
| 10,140,937 B2* | 11/2018 | Jung | .................... | G09G 3/3677 |
| 10,157,566 B2* | 12/2018 | Kim | ..................... | G09G 3/2092 |

(Continued)

FOREIGN PATENT DOCUMENTS

| KR | 100753468 B1 | 8/2007 |
|---|---|---|
| KR | 1020090116288 A | 11/2009 |

*Primary Examiner* — Gene W Lee
(74) *Attorney, Agent, or Firm* — Cantor Colburn LLP

(57) ABSTRACT

A digital-analog converter of the disclosure converts digital image data to generate analog data signals. The digital-analog converter includes a voltage divider which generates a plurality of gamma reference voltages based on a first reference voltage and a second reference voltage; a global ramp including a plurality of gamma decoders which generates a plurality of global gamma voltages based on the gamma reference voltages; a decoder which selects one of the global gamma voltages according to the digital image data to generate the analog data signals; and a ramp controller which turns off at least some of the gamma decoders based on the digital image data.

20 Claims, 18 Drawing Sheets

(56) References Cited

U.S. PATENT DOCUMENTS

| | | | |
|---|---|---|---|
| 10,573,218 B2* | 2/2020 | Bae .................. | G09G 3/2003 |
| 10,692,456 B2* | 6/2020 | Choi .................. | G09G 3/3688 |
| 2004/0233182 A1* | 11/2004 | Chuang .............. | G09G 3/3611 |
| | | | 345/204 |
| 2009/0278865 A1 | 11/2009 | Kang et al. | |
| 2012/0206506 A1* | 8/2012 | Kim .................. | G09G 3/20 |
| | | | 345/690 |
| 2015/0243204 A1* | 8/2015 | Park .................. | G09G 3/3688 |
| | | | 345/212 |

* cited by examiner

DIGITAL-ANALOG CONVERTER, DATA DRIVING CIRCUIT HAVING THE SAME, AND DISPLAY DEVICE HAVING THE SAME

This application claims priority to Korean Patent Application No. 10-2020-0085697, filed on Jul. 10, 2020, and all the benefits accruing therefrom under 35 U.S.C. § 119, the content of which in its entirety is herein incorporated by reference.

BACKGROUND

1. Field

The disclosure relates to a digital-analog converter, a data driving circuit having the same, and a display device having the same.

2. Description of the Related Art

A display device converts an externally input digital image signal into an analog signal using a digital-analog converter ("DAC") and provides the analog signal to a display panel. As resolution of the display device increases, the number of bits of the digital image signal increases. Accordingly, there is a problem that a capacity and the number of elements for implementing the digital-analog converter increase and power consumption increases.

SUMMARY

An aspect of the disclosure is to provide a digital-analog converter capable of reducing power consumption by turning off an operation of at least some of gamma decoders included in a global ramp.

Another aspect of the disclosure is to provide a data driving circuit including the digital-analog converter.

Still another aspect of the disclosure is to provide a display device including the digital-analog converter.

A digital-analog converter according to embodiments of the disclosure converts digital image data to generate analog data signals. The digital-analog converter includes a voltage divider which generates a plurality of gamma reference voltages based on a first reference voltage and a second reference voltage; a global ramp including a plurality of gamma decoders which generates a plurality of global gamma voltages based on the gamma reference voltages; a decoder which selects one of the global gamma voltages according to the digital image data to generate the analog data signals; and a ramp controller which turns off at least some of the gamma decoders based on the digital image data.

In an embodiment, the ramp controller may generate a ramp control signal by comparing most significant bits of the digital image data, and the at least some of the gamma decoders may be turned off based on the ramp control signal.

In an embodiment, the ramp controller may turn off the at least some of the gamma decoders when all of the most significant bits are the same during one horizontal period.

In an embodiment, the ramp controller may turn off gamma decoders among the gamma decoders except for gamma decoders that generate global gamma voltages corresponding to a value of the most significant bits among the plurality of global gamma voltages.

In an embodiment, the ramp controller may generate a ramp control signal by comparing most significant bits of the digital image data and comparing second most significant bits of the digital image data, and the at least some of the gamma decoders may be turned off based on the ramp control signal.

In an embodiment, the ramp controller may turn off the at least some of the gamma decoders when all of the most significant bits are the same and all of the second most significant bits are the same.

In an embodiment, the ramp controller may turn off gamma decoders among the gamma decoders except for gamma decoders that generate global gamma voltages corresponding to a value of the most significant bits and a value of the second most significant bits among the plurality of global gamma voltages.

In an embodiment, the voltage divider may include a plurality of resistors connected in series between a supplier of the first reference voltage and a supplier of the second reference voltage, and generate the gamma reference voltages based on voltages divided between the first reference voltage and the second reference voltage.

In an embodiment, the digital image data may be h bits, may include higher bits of n bits and lower bits of m bits, and the h may correspond to the sum of the m and the n.

In an embodiment, the digital-analog converter may further include a code generator which generates a digital code corresponding to the lower bits of the digital image data, and the global ramp may generate the global gamma voltages in response to the digital code.

In an embodiment, the decoder may generate the analog data signals in response to an input code corresponding to the higher bits of the digital image data.

In an embodiment, the second reference voltage may be a ground voltage.

A data driving circuit according to embodiments of disclosure includes a digital-analog converter which converts digital image data to generate analog data signals; and a buffer which outputs data voltages to data lines based on the analog data signals. The digital-analog converter includes a voltage divider which generates a plurality of gamma reference voltages based on a first reference voltage and a second reference voltage; a global ramp including a plurality of gamma decoders which generates a plurality of global gamma voltages based on the gamma reference voltages; a decoder which selects one of the global gamma voltages according to the digital image data to generate the analog data signals; and a ramp controller which turns off at least some of the gamma decoders based on the digital image data.

In an embodiment, the ramp controller may generate a ramp control signal by comparing most significant bits of the digital image data corresponding to the data lines, respectively, and the at least some of the gamma decoders may be turned off based on the ramp control signal.

In an embodiment, the ramp controller may turn off gamma decoders among the gamma decoders except for gamma decoders that generate global gamma voltages corresponding to a value of the most significant bits among the plurality of global gamma voltages, when all of the most significant bits are the same.

In an embodiment, the ramp controller may generate a ramp control signal by comparing most significant bits of the digital image data corresponding to the data lines, respectively, and comparing second most significant bits of the digital image data, and the at least some of the gamma decoders may be turned off based on the ramp control signal.

In an embodiment, the ramp controller may turn off gamma decoders among the gamma decoders except for gamma decoders that generate global gamma voltages corresponding to a value of the most significant bits and a value of the second most significant bits among the plurality of global gamma voltages, when all of the most significant bits are the same and all of the second most significant bits are the same.

A display device according to embodiments of the disclosure includes a display panel including a plurality of pixels, a data driving circuit which provides data signals to the pixels through data lines; and a timing controller which provides image data to the data driving circuit. The data driving circuit includes a digital-analog converter which converts the image data of a digital format to generate the analog data signals of an analog format; and a buffer which outputs the data signals to the data lines. The digital-analog converter includes a voltage divider which generates a plurality of gamma reference voltages based on a first reference voltage and a second reference voltage; a global ramp including a plurality of gamma decoders which generates a plurality of global gamma voltages based on the gamma reference voltages; and a decoder which selects one of the global gamma voltages according to the image data to generate the analog data signals. The timing controller turns off at least some of the gamma decoders based on the image data.

In an embodiment, the timing controller may include a ramp controller which generates a ramp control signal by comparing most significant bits of the image data corresponding to the data lines, respectively, and the at least some of the gamma decoders may be turned off based on the ramp control signal.

In an embodiment, the timing controller may include a ramp controller which generates a ramp control signal by comparing most significant bits of the image data corresponding to the data lines, respectively, and comparing second most significant bits of the digital image data, and the at least some of the gamma decoders may be turned off based on the ramp control signal.

The digital-analog converter according to embodiments of the disclosure may reduce power consumption by turning off an operation of at least some of gamma decoders included in a global ramp in one horizontal period by comparing the most significant bits of image data corresponding to channels, respectively.

However, an effect of the disclosure is not limited to the above-described effect, and may be variously expanded without departing from the spirit and scope of the disclosure.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
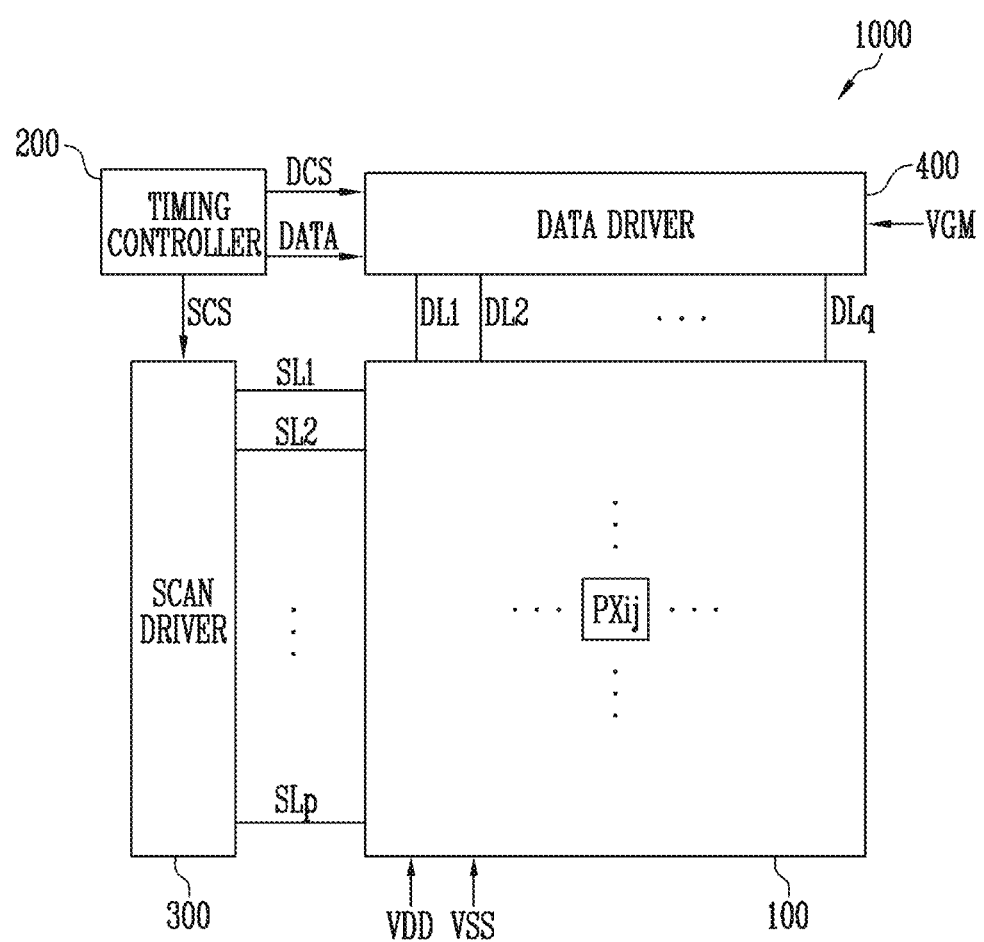
FIG. 1 is a block diagram illustrating a display device according to embodiments of the disclosure.

The disclosure may be modified in various manners and have various forms. Therefore, specific embodiments will be illustrated in the drawings and will be described in detail in the specification. However, it should be understood that the disclosure is not intended to be limited to the disclosed specific forms, and the disclosure includes all modifications, equivalents, and substitutions within the spirit and technical scope of the disclosure.

Similar reference numerals are used for similar components in describing each drawing. In the accompanying drawings, the dimensions of the structures are shown enlarged from the actual dimensions for the sake of clarity of the disclosure. Terms of "first", "second", and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component. The singular expressions include plural expressions unless the context clearly indicates otherwise.

It should be understood that in the present application, a term of "include", "have", or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "or" means "and/or." As used herein, the term "and/or" includes any and all combinations of one or more of the associated listed items. In addition, a case where a portion is "connected" to another portion, the case includes not only a case where the portion is directly connected to the other portion but also a case where the portion is connected to the other portion with another element interposed therebetween.

Hereinafter, embodiments of the disclosure will be described in detail with reference to the accompanying drawings.

FIG. 1 is a block diagram illustrating a display device according to embodiments of the disclosure.

Referring to FIG. 1, the display device 1000 may include a display panel 100, a timing controller 200, a scan driver 300 (or a scan driving circuit), and a data driver 400 (or a data driving circuit).

The display panel 100 may include pixels. Each pixel PXij may be connected to corresponding data line and scan line. i and j may be integers greater than 0. The pixel PXij may refer to a pixel in which a scan transistor is connected to an i-th scan line and a j-th data line. Each pixel PXij may receive voltages of first power VDD and second power VSS from the outside. Here, the first power VDD and the second power VSS may be voltages required for an operation of the pixels. For example, the first power VDD may have a voltage level higher than a voltage level of the second power VSS.

The timing controller 200 may generate a data control signal DCS for controlling the data driver 400 and a scan control signal SCS for controlling the scan driver 300. The data control signal DCS may include a clock signal supplied to a register of the data driver 400, a line latch signal supplied to a latch, and the like. In addition, the timing controller 200 may provide image data DATA of a digital format to the data driver 400.

The scan driver 300 may supply scan signals to the pixels through scan lines SL1, SL2, ..., and SLp in response to the scan control signal SCS. p may be an integer greater than 0.

The data driver 400 may convert the image data DATA of the digital format into data signals (data voltages) of an analog format in response to the data control signal DCS, and may supply the data signals (data voltages) to the pixels through data lines DL1, DL2, ..., and DLq. q may be an integer greater than 0.

The data driver 400 may receive a reference voltage VGM from the outside (for example, a gamma voltage generator), convert the digital image data DATA into an analog signal, that is, a grayscale voltage, and supply the analog signal to the pixels as a data signal (data voltage).

Figure 2:
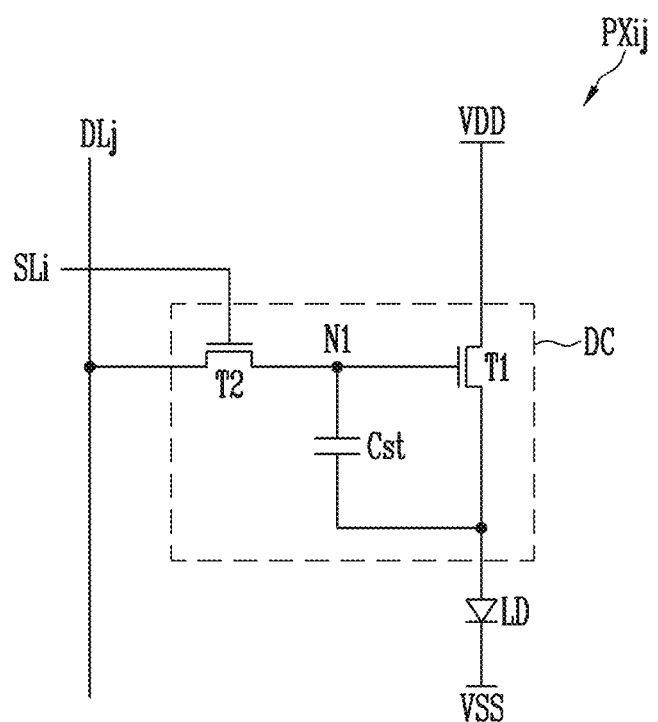
FIG. 2 is a circuit diagram illustrating an example of a pixel included in the display device of FIG. 1.

FIG. 2 is a circuit diagram illustrating an example of the pixel included in the display device of FIG. 1.

Referring to FIG. 2, the pixel PXij may include a light emitting element LD and a driving circuit DC connected to the light emitting element LD to drive the light emitting element LD.

A first electrode (for example, an anode electrode) of the light emitting element LD may be supplied with the first power VDD via the driving circuit DC, and a second electrode (for example, a cathode electrode) of the light emitting element LD may be supplied with the second power VSS. The light emitting element LD may emit light at a luminance corresponding to a driving current amount flowing through the light emitting element LD and controlled by the driving circuit DC.

The light emitting device LD may be selected as an organic light emitting diode. In another embodiment, the light emitting element LD may be selected as an inorganic light emitting diode, such as a micro light emitting diode ("LED") or a quantum dot light emitting diode. In still another embodiment, the light emitting element LD may be an element configured of an organic material and an inorganic material in combination. In FIG. 2, the pixel PXij includes a single light emitting element LD. However, in another embodiment, the pixel PXij may include a plurality of light emitting elements, and the plurality of light emitting elements may be connected to each other in series, in parallel, or in series and parallel.

The first power VDD and the second power VSS may have different values. For example, a voltage value of the first power VDD may be greater than a voltage value of the second power VSS.

The driving circuit DC may include a first transistor T1, a second transistor T2, and a storage capacitor Cst.

A first electrode of the first transistor T1 (a driving transistor) may be supplied with the first power VDD, and a second electrode of the first transistor T1 may be electrically connected to the first electrode (for example, the anode electrode) of the light emitting element LD. A gate electrode of the first transistor T1 may be connected to a first node N1. The first transistor T1 may control the driving current amount supplied to the light emitting element LD in correspondence with a data signal supplied to the first node N1 through the data line DLj.

A first electrode of the second transistor T2 (a switching transistor) may be connected to the data line DLj, and the second electrode of the second transistor T2 may be connected to the first node N1. A gate electrode of the second transistor T2 may be connected to the scan line SLi.

The second transistor T2 may be turned on when a scan signal of a voltage (for example, a gate-on voltage) at which the second transistor T2 may be turned on is supplied from the scan line SLi, to electrically connect the data line DLj and the first node N1. At this time, the data signal of a corresponding frame may be supplied to the data line DLj, and thus the data signal may be transferred to the first node N1. A voltage corresponding to the data signal transferred to the first node N1 may be stored in the storage capacitor Cst.

One electrode of the storage capacitor Cst may be connected to the first node N1, and another electrode of the storage capacitor Cst may be connected to the first electrode of the light emitting element LD. The storage capacitor Cst may be charged with a voltage corresponding to the data signal supplied to the first node N1, and may maintain the charged voltage until the data signal of the next frame is supplied.

FIG. 2 shows a relatively simple pixel PXij for convenience of description, and a structure of the driving circuit DC may be variously changed in another embodiment. For example, the driving circuit DC may further include other circuit elements such as various transistors, for example, a compensation transistor for compensating for a threshold voltage of the first transistor T1, an initialization transistor for initializing the first node N1, and/or a light emission control transistor for controlling a light emission time of the light emitting element LD, and a boosting capacitor for boosting the voltage of the first node N1.

In addition, in FIG. 2, the transistors included in the driving circuit DC, for example, the first and second transistors T1 and T2 are N-type transistors, but the disclosure according to the invention is not limited thereto. That is, at least one of the first and second transistors T1 and T2 included in the driving circuit DC may be changed to a P-type transistor in another embodiment.

Figure 3:
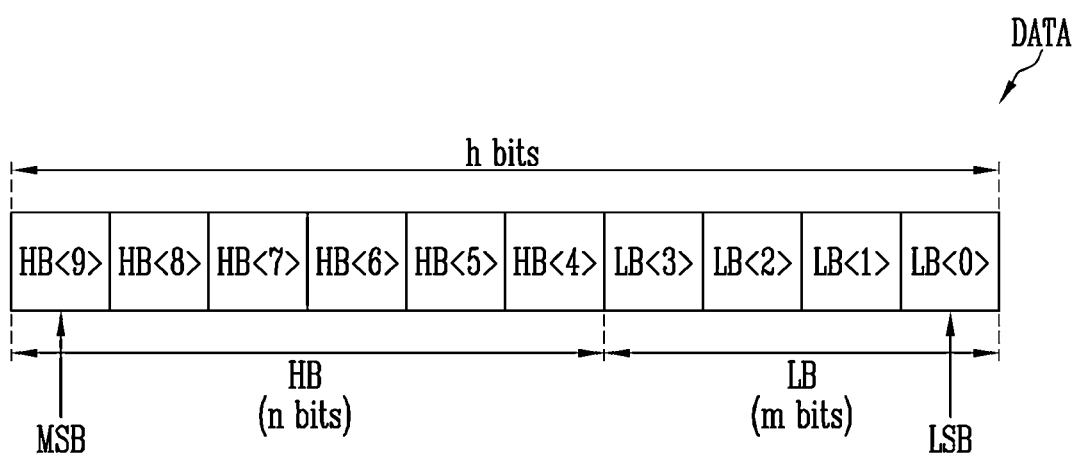
FIG. 3 is a diagram for describing image data according to embodiments of the disclosure.

FIG. 3 is a diagram for describing image data according to embodiments of the disclosure.

Referring to FIGS. 1 and 3, the image data DATA of the digital format supplied from the timing controller 200 to the data driver 400 may be image data of h bits. h may be an integer greater than 0. When the image data DATA is the h bits, the display device 1000 according to embodiments of the disclosure may express $2^h$ grayscales, that is, 0 grayscale to $2^h-1$ grayscale. In FIG. 3, image data DATA of 10 bits is shown as an example, and in the following description, description will be given under an assumption of the image data DATA of 10 bits unless otherwise specified.

In an embodiment, the image data DATA according to embodiments of the disclosure may include higher bits HB of n bits including the most significant bit MSB and lower bits LB of m bits including the least significant bit LSB. Here, the most significant bit MSB may correspond to a bit position having the highest value of the image data DATA, and the least significant bit LSB may correspond to a bit position having the lowest value of the image data DATA.

Here, n may be an integer greater than 0, and m may be an integer greater than 0. In addition, in embodiments of the disclosure, the higher bits HB may be n bits (e.g., HB<9> to HB<4>) as bit positions having a high value of the image data DATA, and the lower bits LB may be m bits (e.g., LB<3> to LB<0>) as bit positions having a low value of the image data DATA. Here, 'h=n+m' may be satisfied. In FIG. 3, the higher bits HB of 6 bits and the lower bits LB of 4 bits are shown as an example. However, in an embodiment, the number of bits included in each of the higher bits HB and the lower bits LB may be variously set. Hereinafter, description will be given under an assumption that the image data DATA includes the higher bits HB of 6 bits and the lower bits LB of 4 bits unless otherwise specified.

Figure 4:
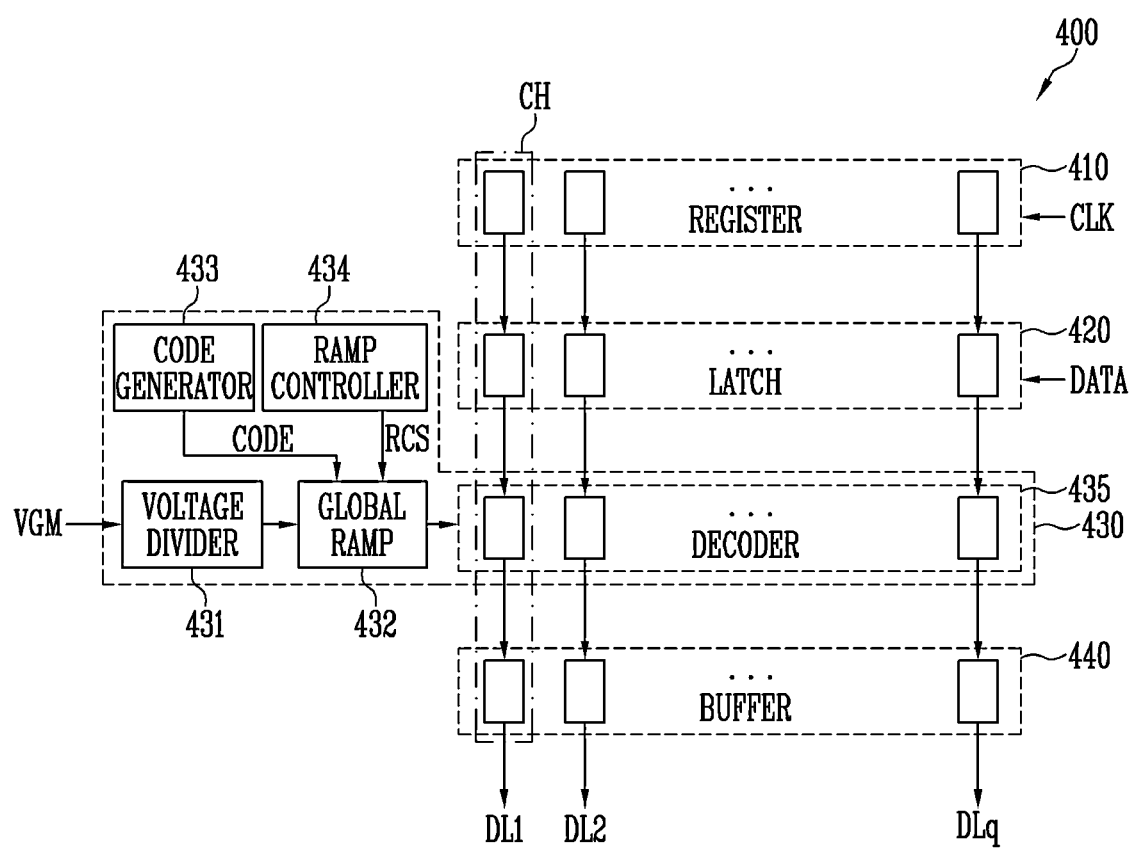
FIG. 4 is a block diagram illustrating a data driving circuit according to embodiments of the disclosure.
Figure 8:
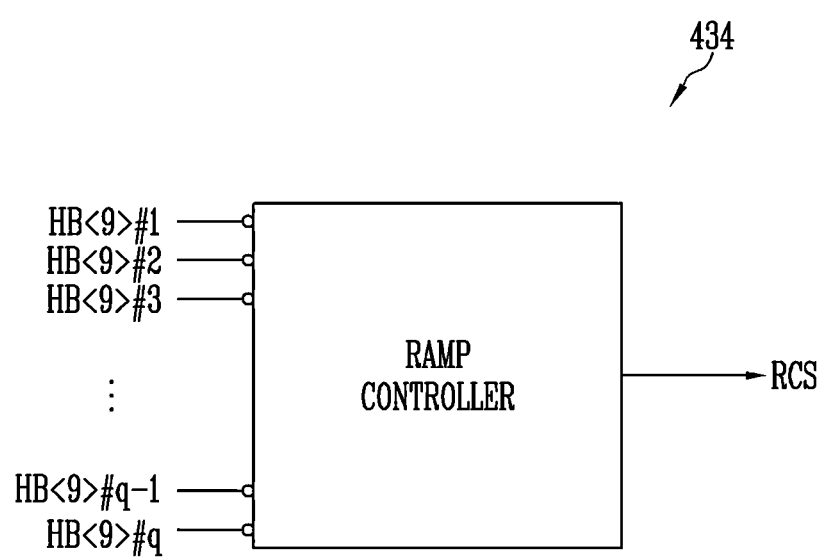
Figure 9:
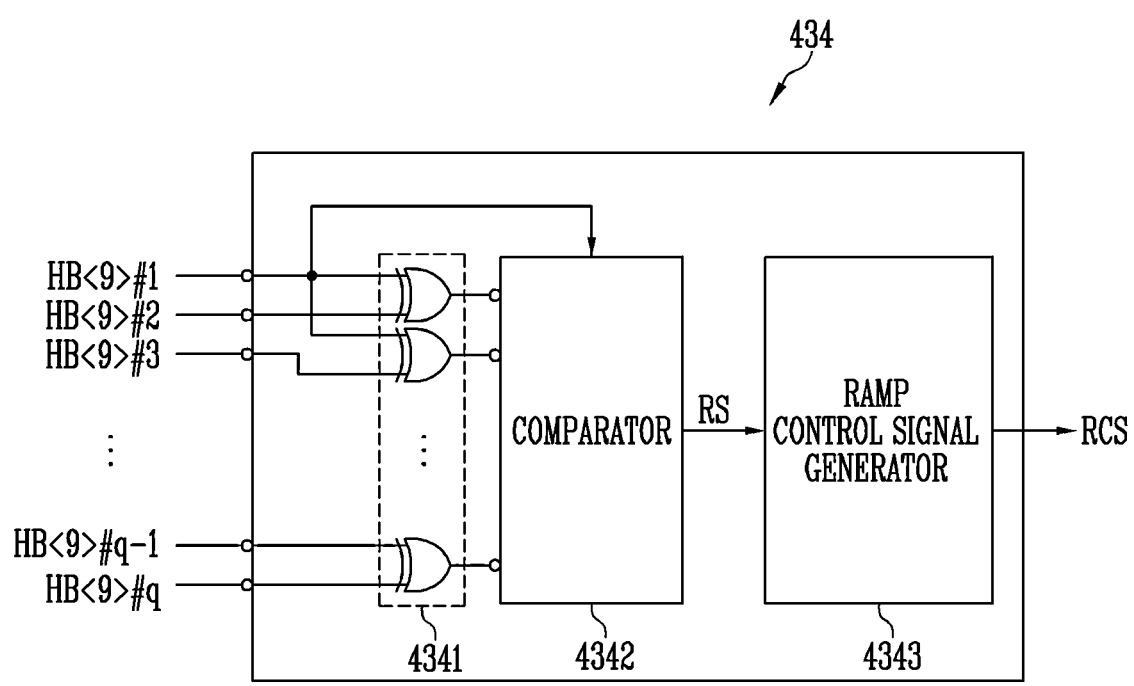
Figure 10A:
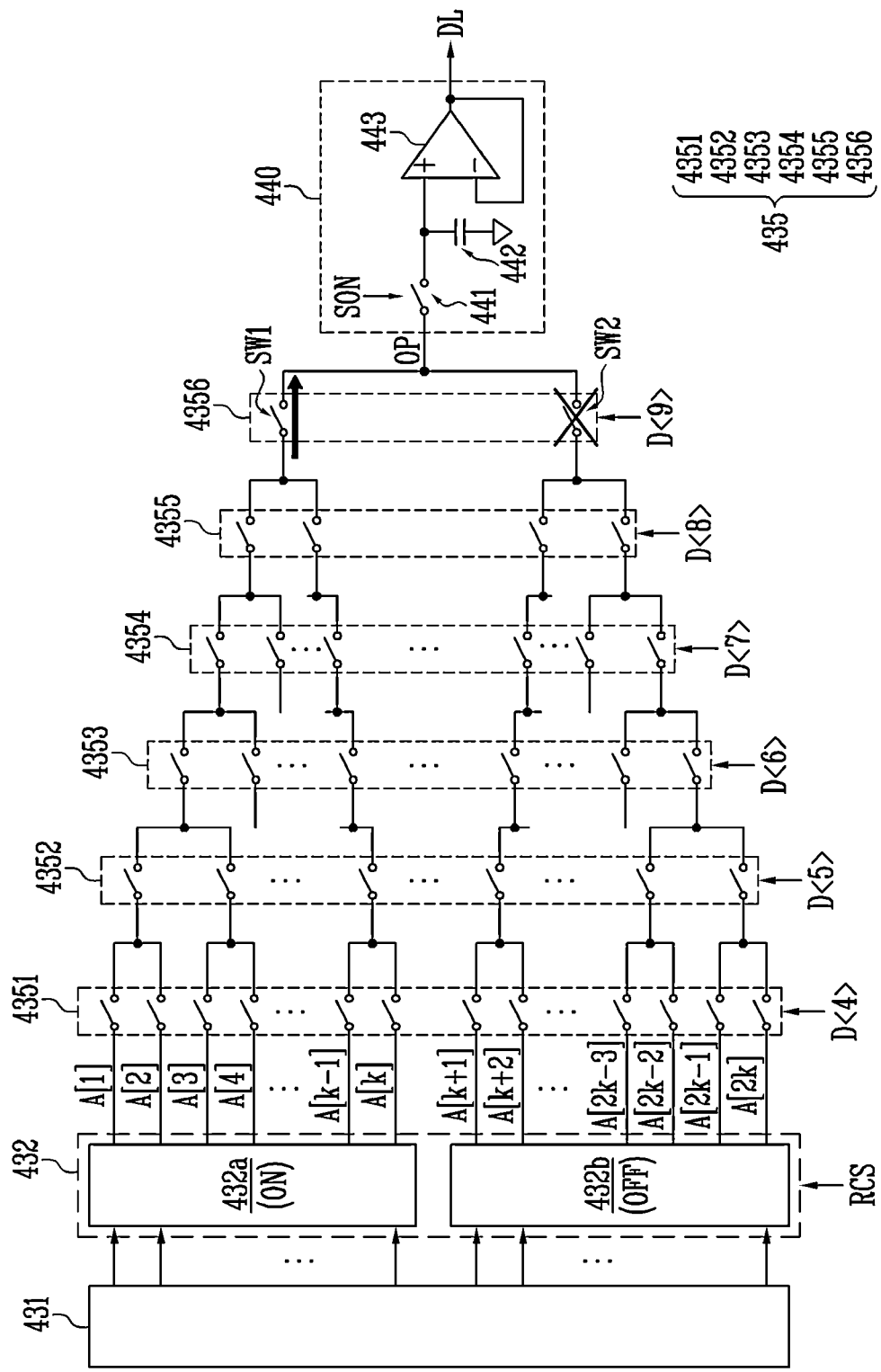
FIGS. 10A and 10B are diagrams for describing examples of an operation of the digital-analog converter according to FIGS. 5 to 9.
Figure 10B:
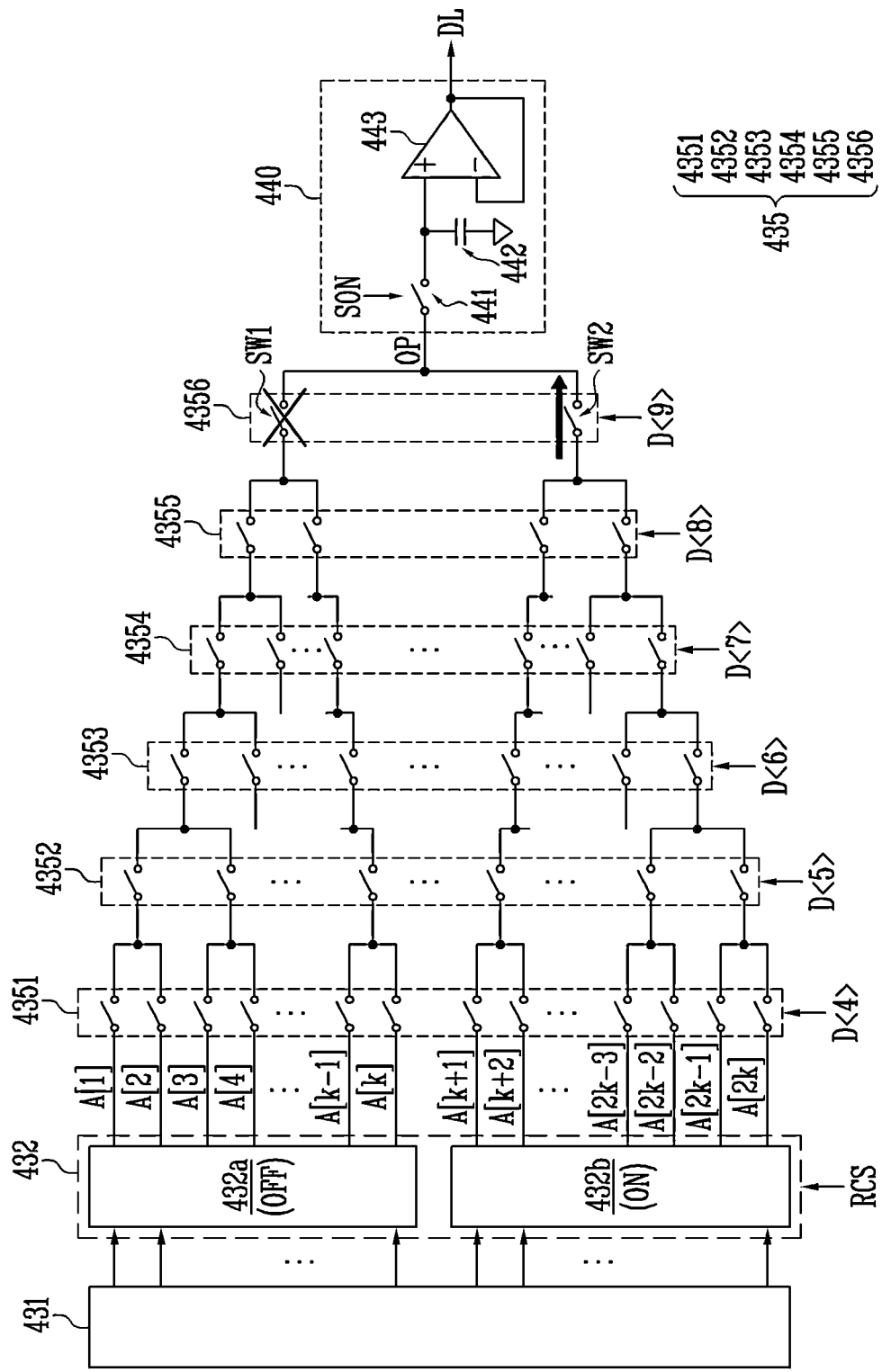

FIG. 4 is a block diagram illustrating a data driving circuit according to embodiments of the disclosure, FIGS. 5 to 9 are diagrams for describing a digital-analog converter according to embodiments of the disclosure, and FIGS. 10A and 10B are diagrams for describing examples of an operation of the digital-analog converter according to FIGS. 5 to 9.

Referring to FIGS. 1, 3, and 4, the data driver 400 (or the data driving circuit) may include a register 410, a latch 420, a digital-analog converter 430, and a buffer 440.

The register 410 may sequentially activate latch clock signals in synchronization with a clock signal CLK and provide latch clock signals to the latch 420. The register 410 may include a plurality of shift registers.

The latch 420 may receive the latch clock signals sequentially provided from the register 410, and sample and latch the image data DATA of the digital format in synchronization with the latch clock signals. In addition, the latch 420 may provide the latched digital image data DATA to the digital-analog converter 430 in response to the line latch signal.

The digital-analog converter 430 may convert the digital image data DATA provided from the latch 420 into an analog signal. The digital-analog converter 430 may receive the reference voltage VGM supplied from the gamma voltage generator, convert the digital image data DATA into an analog signal (i.e., a grayscale voltage), and provide the converted analog signal to the buffer 440 as the data signal (the data voltage). In embodiments of the disclosure, description will be given based on one channel CH among a plurality of channels and under an assumption that the digital-analog converter 430 is a 10-bit digital-analog converter 430. The image data DATA of 10 bits shown in FIG. 3 may be input to the 10-bit digital-analog converter 430.

In an embodiment, the digital-analog converter 430 may include a voltage divider 431, a global ramp 432, a code generator 433, and a decoder 435.

The code generator 433 may generate a digital code CODE by counting an oscillation signal having a divided frequency generated by a frequency divider. For example, the code generator 433 may be implemented as a counter. For example, the code generator 433 may count the number of rising or falling edges of the oscillation signal and generate the digital code CODE of m bits corresponding to a count result. The digital code CODE may be determined according to the lower bits LB of the image data DATA. Accordingly, hereinafter, it is assumed that the code generator 433 is a 4-bit counter, and in this case, the code generator 433 may output a 4-bit digital code CODE that is incremented by 1 per every period of the oscillation signal divided from 0 (for example, 0000) to 15 (for example, 1111). The output digital code CODE may be provided to the global ramp 432.

The voltage divider 431 may receive the reference voltage VGM, which is a gamma power voltage supplied from the gamma voltage generator, and generate a plurality of gamma reference voltages for expressing a predetermined grayscale using the reference voltage VGM. In response to the image data DATA of 10 bits, the voltage divider 431 may generate $2^{10}$, that is, 1024 gamma reference voltages.

The global ramp 432 may receive the plurality of gamma reference voltages from the voltage divider 431 and generate global gamma voltages in response to the digital code CODE supplied from the code generator 433.

Figure 5:
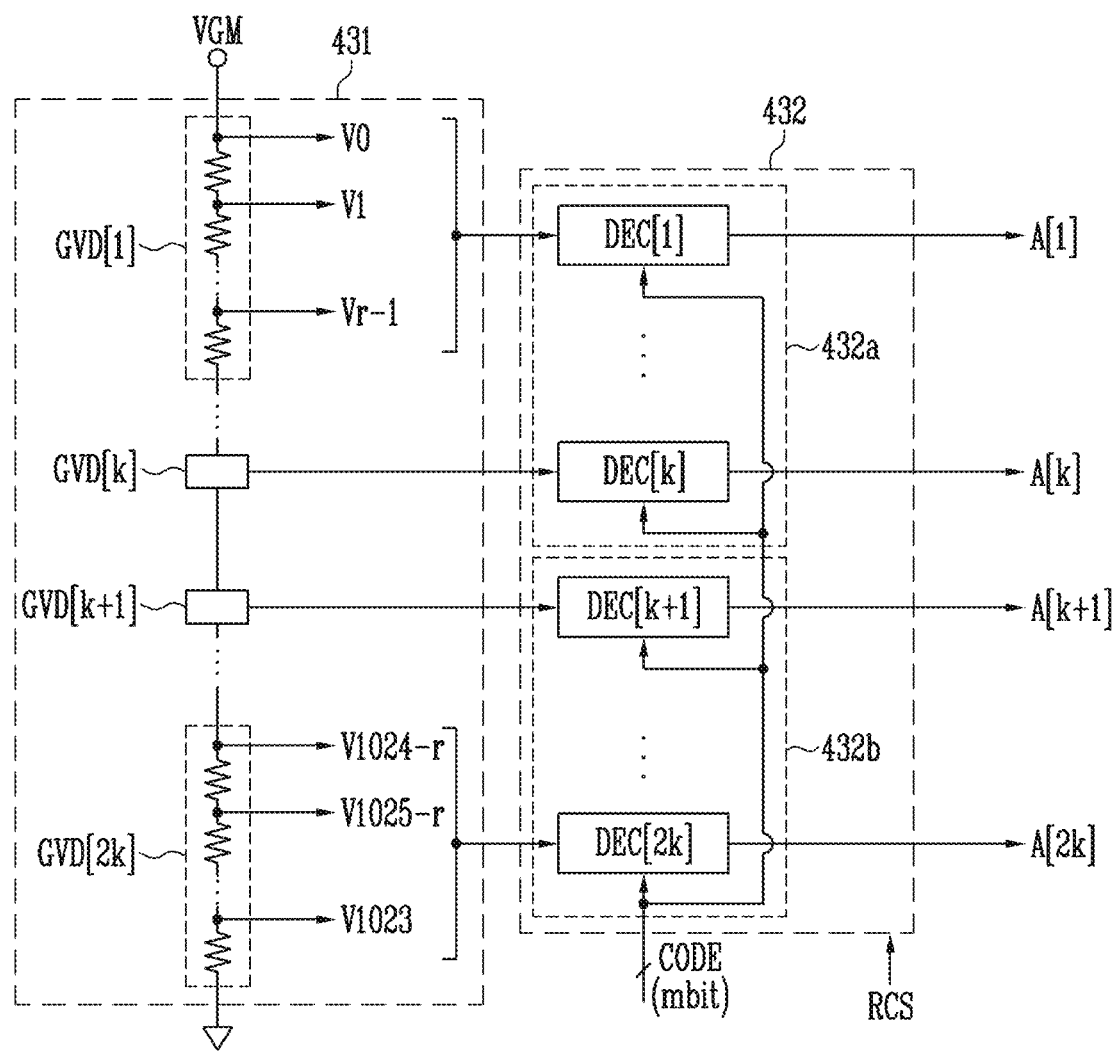
FIGS. 5 to 9 are diagrams for describing a digital-analog converter according to embodiments of the disclosure.

Referring to FIG. 5 additionally, to specifically describe the voltage divider 431 and the global ramp 432, the voltage divider 431 may generate a plurality of gamma reference voltages V0 to V1023 for expressing a predetermined grayscale based on the reference voltage VGM.

In an embodiment, the voltage divider 431 may include 2k gamma voltage dividers GVD[1] to GVD[2k], and the gamma voltage dividers GVD[1] to GVD[2k] may be connected in series between a supplier of the reference voltage VGM (i.e., a first reference voltage) and a supplier of a ground voltage (i.e., a second reference voltage). In addition, each of the gamma voltage dividers GVD[1] to GVD[2k] may include a plurality of resistors connected in series. Each of the gamma voltage dividers GVD[1] to GVD[2k] may generate r gamma reference voltages through a voltage distribution of the resistor. For example, the first gamma voltage divider GVD[1] may generate r gamma reference voltages V0 to Vr−1 through a voltage distribution of the resistor using the plurality of resistors connected in series. Accordingly, the voltage divider 431 may generate the plurality of gamma reference voltages V0 to V1023. Here, k and r are natural numbers.

In FIGS. 5 to 10B, it is assumed that r is $2^4$, that is, 16, and 2k is 1024/16, that is, 64(=$2^6$), in correspondence with the lower bits LB of 4 bits and the digital code CODE of 4 bits.

The global ramp 432 may receive the gamma reference voltages V0 to V1023, and may generate 2k global gamma voltages A[1] to A[2k] of a step wave form, in which each of 2k global gamma voltages A[1] to A[2k] is sequentially rising or falling. Here, the global gamma voltages A[1] to A[2k] may be commonly provided to each channel CH.

In an embodiment, the global ramp 432 may include 2k gamma decoders DEC[1] to DEC[2k] corresponding to the 2k gamma voltage dividers GVD[1] to GVD[2k], respectively. Each of the gamma decoders DEC[1] to DEC[2k] may receive r gamma reference voltages among the plurality of gamma reference voltages V0 to V1023 through a corresponding gamma voltage divider, and may be implemented as an r bit decoder that outputs one global gamma voltage in correspondence with the digital code CODE of m bits (e.g., the digital code CODE of 4 bits).

Figure 6:
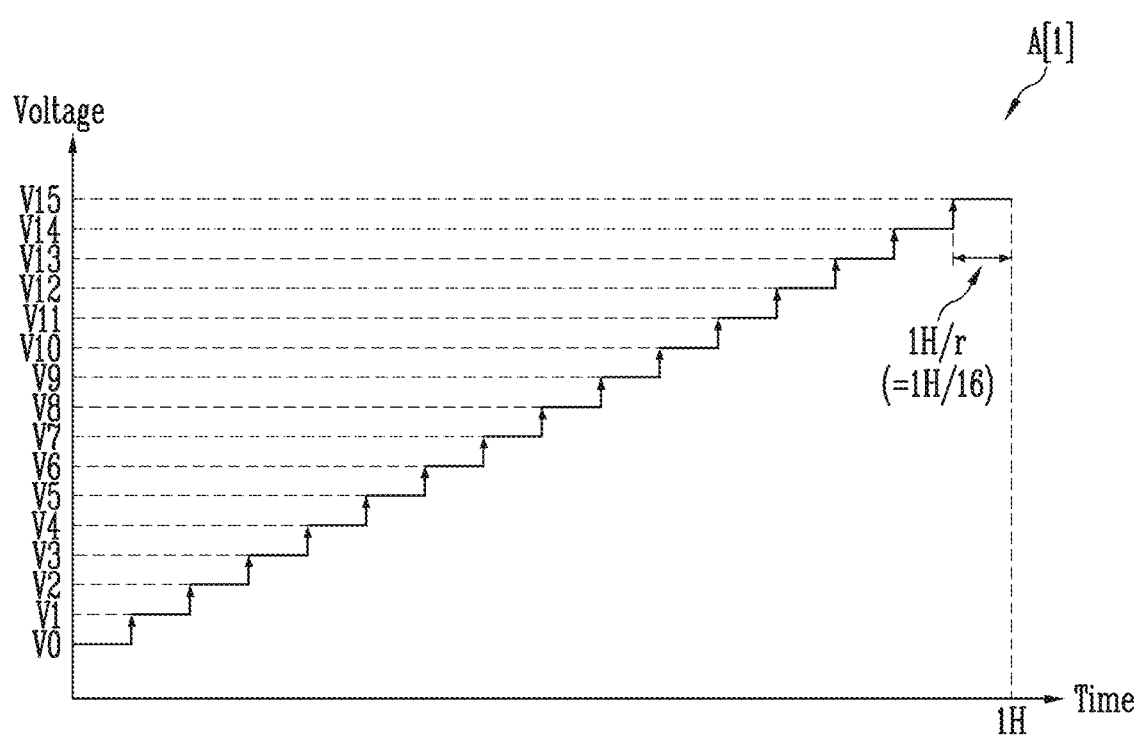

In an embodiment, for example, description is given based on the first gamma decoder DEC[1] with reference to FIG. 6 additionally. The first gamma decoder DEC[1] may include a plurality of switches receiving r gamma reference voltages V0 to Vr−1 from the first gamma voltage divider GVD[1].

Here, one corresponding switch among the plurality of switches may be sequentially turned on based on the digital code CODE of m bit, which is sequentially rising (or falling). Accordingly, the first gamma decoder DEC[1] may output the first global gamma voltage A[1] of a step wave form which is sequentially rising (or falling) by sequentially outputting the r gamma reference voltages V0 to Vr−1.

Accordingly, the first gamma decoder DEC[1] may receive the r gamma reference voltages V0 to Vr−1 from the first gamma voltage divider GVD[1] to output the first global gamma voltage A[1], the k-th gamma decoder DEC[k] may receive the r gamma reference voltages from the k-th gamma voltage divider GVD[k] to output the k-th global gamma voltage A[k], the (k+1)-th gamma decoder DEC[k+1] may receive the r gamma reference voltages from the (k+1)-th gamma voltage divider GVD[k+1] to output the (k+1)-th global gamma voltage A[k+1], and the 2k-th gamma decoder DEC[2k] may receive the r gamma reference voltages V1024−r to V1023 from the 2k-th gamma voltage divider GVD[2k] to output the 2k-th global gamma voltage A[2k].

The digital code CODE of m bits (e.g., the digital code CODE of 4 bits) may have a rising period (or a falling period) corresponding to one horizontal period 1H and sequentially increase (or decrease). For example, the digital code CODE of 4 bits may increase from 0 (for example, 0000) to 15 (for example, 1111) by 1 at a time interval of 1H/r (or 1H/16) during 1 horizontal period 1H. Accordingly, as shown in FIG. 6, each of the gamma decoders DEC[1] to DEC[2k] may generate the global gamma voltage (for example, the first global gamma voltage A[1] of FIG. 5) of a step wave form sequentially rising at a time interval of 1H/r during one horizontal period 1H.

In an embodiment, the global ramp 432 may be divided into a first sub global ramp 432a including the k gamma decoders DEC[1] to DEC[k] and a second sub global ramp 432b including the k gamma decoders DEC[k+1] to DEC[2k].

In an embodiment, the global ramp 432 may turn off an operation of one of the first sub global ramp 432a and the second sub global ramp 432b based on a ramp control signal RCS. A configuration in which the global ramp 432 turns off the operation of one of the first and second sub global ramps 432a and 432b based on the ramp control signal RCS is specifically described with reference to FIGS. 8 to 10B.

The decoder 435 may receive the global gamma voltages A[1] to A[2k] from the global ramp 432, and may output one global gamma voltage corresponding to each channel CH to the buffer 440 as the data signal (the data voltage). Here, the one global gamma voltage is chosen among the global gamma voltages A[1] to A[2k].

Figure 7:
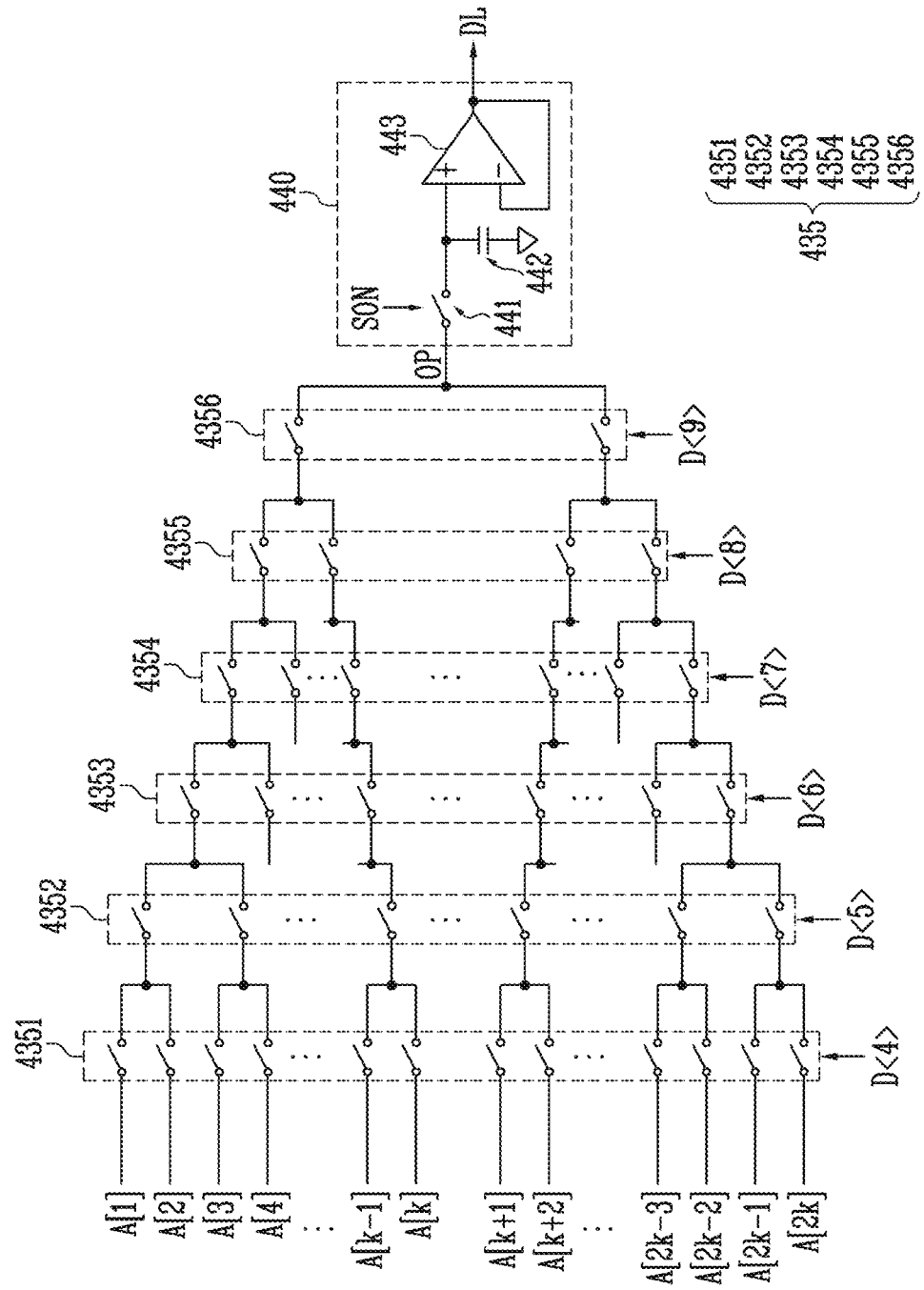

Referring to FIG. 7 additionally to specifically describe the decoder 435, the decoder 435 may be implemented as an n bit decoder in correspondence with each channel CH. The configuration of the decoder 435 may be determined according to the higher bits HB of the image data DATA. Accordingly, hereinafter, it is assumed that the decoder 435 is a 6-bit decoder. Since the decoder 435 is the 6-bit decoder, input codes D<4> to D<9> of 6 bits may be input to the decoder 435 as an input code.

The decoder 435 may include selectors 4351, 4352, 4353, 4354, 4355, and 4356, of which each is configured of a switch. For example, the switch may be implemented as a transistor that functions as a switching function. However, this is exemplary, and a configuration of the decoder 435 according to the invention is not limited thereto.

The selectors 4351, 4352, 4353, 4354, 4355, and 4356 may be connected to each other (e.g., sequentially connected), and the switches included in the selectors 4351, 4352, 4353, 4354, 4355, and 4356 may be turned on or turned off in response to the input codes D<4> to D<9>. The selectors 4351, 4352, 4353, 4354, 4355, and 4356 may be operated in response to the input codes D<4> to D<9>, respectively.

The decoder 435 may select one of the global gamma voltages A[1] to A[2k] in response to the input codes D<4> to D<9> of 6 bits. At this time, the decoder 435 may select one global gamma voltage in synchronization with a timing of a voltage level corresponding to the channel CH among the global gamma voltages of one step wave form.

In an embodiment, for example, assuming that a voltage of a first voltage level V0 is selected among voltage levels of the first global gamma voltage A[1] of a sequentially rising step wave form, 0 (for example, 0000) is applied to the first gamma decoder DEC[1]. Therefore, the decoder 435 may select the first global gamma voltage A[1] of the first voltage level V0 in response to the input bits D<4> to D<9> of $2^6$ (for example, 111111) in synchronization with a timing at which the first global gamma voltage A[1] of the first voltage level V0 is output. At this time, a node to which the first global gamma voltage A[1] is applied and an output node OP may be connected by the switches turned on in response to the input bits D<4> to D<9> of $2^6$ (for example, 111111). Accordingly, the first global gamma voltage A[1] of the first voltage level V0 may be selected.

The buffer 440 may include a channel switch 441, a capacitor 442, and an output buffer 443.

The channel switch 441 may provide the data signal output from the digital-analog converter 430 (or the decoder 435) to the output buffer 443 in response to a switch control signal SON corresponding to a corresponding channel CH and supplied in one horizontal period 1H unit.

The capacitor 442 may be disposed between an input terminal of the output buffer 443 and the ground voltage to reduce noise of the data signal.

The output buffer 443 may output the data signal to a data line DL connected in correspondence with a corresponding channel CH.

As described above, the digital-analog converter 430 according to embodiments of the disclosure includes the global ramp 432 that generates the global gamma voltages A[1] to A[2k] commonly provided to each channel CH. Therefore, the digital-analog converter 430 (or the data driving circuit 400) may be implemented in a relatively small area.

In addition, the digital-analog converter 430 according to embodiments of the disclosure may reduce power consumption by comparing the most significant bits MSB of the image data DATA corresponding to each channel CH and turning off an operation of at least some of the gamma decoders DEC[1] to DEC[2k] included in the global ramp 432 according to the comparison result. For example, the digital-analog converter 430 may further include the ramp controller 434, and the ramp controller 434 may generate the ramp control signal RCS by comparing the most significant bits MSB of the image data DATA corresponding to each channel CH. In addition, the global ramp 432 may turn off an operation of one of the first sub global ramp 432a and the second sub global ramps 432b. The first sub global ramp 432a may include the first to k-th gamma decoders DEC[1] to DEC[k], and the second sub global ramps 432b may include the (k+1)-th to 2k gamma decoders DEC[k+1] to DEC[2k].

Referring to FIG. 8 additionally to specifically describe this, the ramp controller 434 may generate the ramp control signal RCS based on most significant bits HB<9>#1 to HB<9>#q corresponding to each channel CH. In FIG. 8, each of the most significant bits HB<9>#1 to HB<9>#q may correspond to a bit position having the highest value among the bit positions of each of the image data DATA. The most significant bits HB<9>#1 to HB<9>#q may have a value of 0 or 1 at the bit position having the highest value.

In an embodiment, the ramp controller 434 may generate the ramp control signal RCS by comparing the most significant bits HB<9>#1 to HB<9>#q. The ramp controller 434 may determine gamma decoders to be turned off among the gamma decoders DEC[1] to DEC[2k] included in the global ramp 432 by comparing the most significant bits HB<9>#1 to HB<9>#q and then generate the ramp control signal RCS based on the determination. For example, the ramp controller 434 may be configured as a single logic circuit or a combination of a plurality of logic circuits to compare the most significant bits HB<9>#1 to HB<9>#q.

When all of the most significant bits HB<9>#1 to HB<9>#q are the same, the ramp controller 434 may generate the ramp control signal RCS to turn off the operation of one of the first sub global ramp 432a and the second sub global ramp 432b. For example, when all of the most significant bits HB<9>#1 to HB<9>#q have a value of 1, the ramp controller 434 may turn off the operation of the second sub global ramp 432b, and when all of the most significant bits HB<9>#1 to HB<9>#q have a value of 0, the ramp controller 434 may turn off the operation of the first sub global ramp 432a.

Referring to FIG. 9 as an example, the ramp controller 434 may include an exclusive-OR circuit 4341, a comparator 4342, and a ramp control signal generator 4343.

The exclusive-OR circuit 4341 may include a plurality of XOR gates. Each of the plurality of XOR gates may be implemented as a 2-input structure, and receive two most significant bits among the most significant bits HB<9>#1 to HB<9>#q. Here, the exclusive-OR circuit 4341 may include (q−1)X(q−2)X . . . X2X1=(q−1)! XOR gates to compare all two sub-sets of the most significant bits HB<9>#1 to HB<9>#q. That is, the number of XOR gates used here may be (q−1)!.

Each of the plurality of XOR gates in the exclusive-OR circuit 4341 may output a value of 0 when both of the two input most significant bits have the same value (e.g., a value of 0 or a value of 1), and may output a value of 1 when the both of the two input most significant bits have different values (that is, one of the input most significant bits has a value of 0 and the other of the input most significant bits has a value of 1).

The comparator 4342 may receive output signals output from the exclusive-OR circuit 4431 and one most significant bit (for example, the first most significant one HB<9>#1) among the most significant bits HB<9>#1 to HB<9>#q, and output a comparison result signal RS.

The ramp control signal generator 4343 may generate the ramp control signal RCS based on the comparison result signal RS.

In an embodiment, when all of the most significant bits HB<9>#1 to HB<9>#q are the same as the value of 1 in correspondence with one horizontal period 1H, the ramp control signal generator 4343 may generate the ramp control signal RCS for turning off the operation of the second sub global ramp 432b during the corresponding horizontal period, based on the comparison result signal RS.

In an embodiment, for example, referring to FIG. 10A, when all of the most significant bits HB<9>#1 to HB<9>#q of the image data DATA corresponding to the channels CH have the value of 1, only the first switch SW1 of the switches SW1 and SW2 included in the selector 4356 corresponding to the most significant bits HB<9>#1 to HB<9>#q may be turned on in response to the input code D<9> having a value of 1. In this case, the second switch SW2 may maintain a turn-off state. In this case, since the second switch SW2 maintains the turn-off state, the global gamma voltages A[k+1] to A[2k] output by the second sub global ramp 432b are not output to the buffer 440.

Accordingly, in order to prevent unnecessary power consumption due to the operation of the second sub global ramp 432b in the corresponding horizontal period, the ramp control signal generator 4343 may generate the ramp control signal RCS for turning off the operation of the second sub global ramp 432b. In this case, the global ramp 432 may turn off the operation of the second sub global ramp 432b based on the ramp control signal RCS provided from the ramp controller 434 (or the ramp control signal generator 4343).

In an embodiment, when all of the most significant bits HB<9>#1 to HB<9>#q are the same as the value of 0 in correspondence with one horizontal period 1H, the ramp control signal generator 4343 may generate the ramp control signal RCS for turning off the operation of the first sub global ramp 432a during the corresponding horizontal period, based on the comparison result signal RS.

In an embodiment, for example, referring to FIG. 10B, when all of the most significant bits HB<9>#1 to HB<9>#q of the image data DATA corresponding to the channels CH have the value of 0, only the second switch SW2 of the switches SW1 and SW2 included in the selector 4356 corresponding to the most significant bits HB<9>#1 to HB<9>#q may be turned on in response to the input code D<9> having a value of 0. In this case, the first switch SW1 may maintain a turn-off state. In this case, since the first switch SW1 maintains the turn-off state, the global gamma voltages A[1] to A[k] output by the first sub global ramp 432a are not output to the buffer 440.

Accordingly, in order to prevent unnecessary power consumption due to the operation of the first sub global ramp 432a in the corresponding horizontal period, the ramp control signal generator 4343 may generate the ramp control signal RCS for turning off the operation of the first sub global ramp 432a. In this case, the global ramp 432 may turn off the operation of the first sub global ramp 432a based on the ramp control signal RCS provided from the ramp controller 434 (or the ramp control signal generator 4343).

On the other hand, when at least one of the most significant bits HB<9>#1 to HB<9>#q has a different value from the other most significant bits, since both of the first and second sub global ramps 432a and 432b are to be operated during one horizontal period, the ramp control signal generator 4343 may generate a ramp control signal RCS for operating the both of the first and second sub global ramps 432a and 432b or may not generate the ramp control signal RCS.

In an embodiment, the global ramp 432 may turn off the operation of the first sub global ramp 432a or the second sub global ramp 432b using a method of cutting off power supplied to the first sub global ramp 432a or the second sub global ramp 432b, based on the ramp control signal RCS.

In FIG. 9, a configuration in which the ramp controller 434 is implemented as the plurality of XOR gates to compare the most significant bits HB<9>#1 to HB<9>#q is shown and described, but this is exemplary and the present disclosure according to the invention is not limited thereto. The ramp controller 434 according to embodiments of the disclosure may be implemented in a form in which a single logic circuit such as an AND gate, or an OR gate, or a plurality of logic circuits in addition to the XOR gate is combined, to compare the most significant bits HB<9>#1 to HB<9>#q.

As described with reference to FIGS. 3 to 10B, the digital-analog converter 430 according to embodiments of the disclosure may reduce power consumption by turning off the operation of at least some of the gamma decoders DEC[1] to DEC[2k] included in the global ramp 432 in one horizontal period by comparing the most significant bits MSB of the image data DATA corresponding to the channels CH, respectively.

Figure 11:
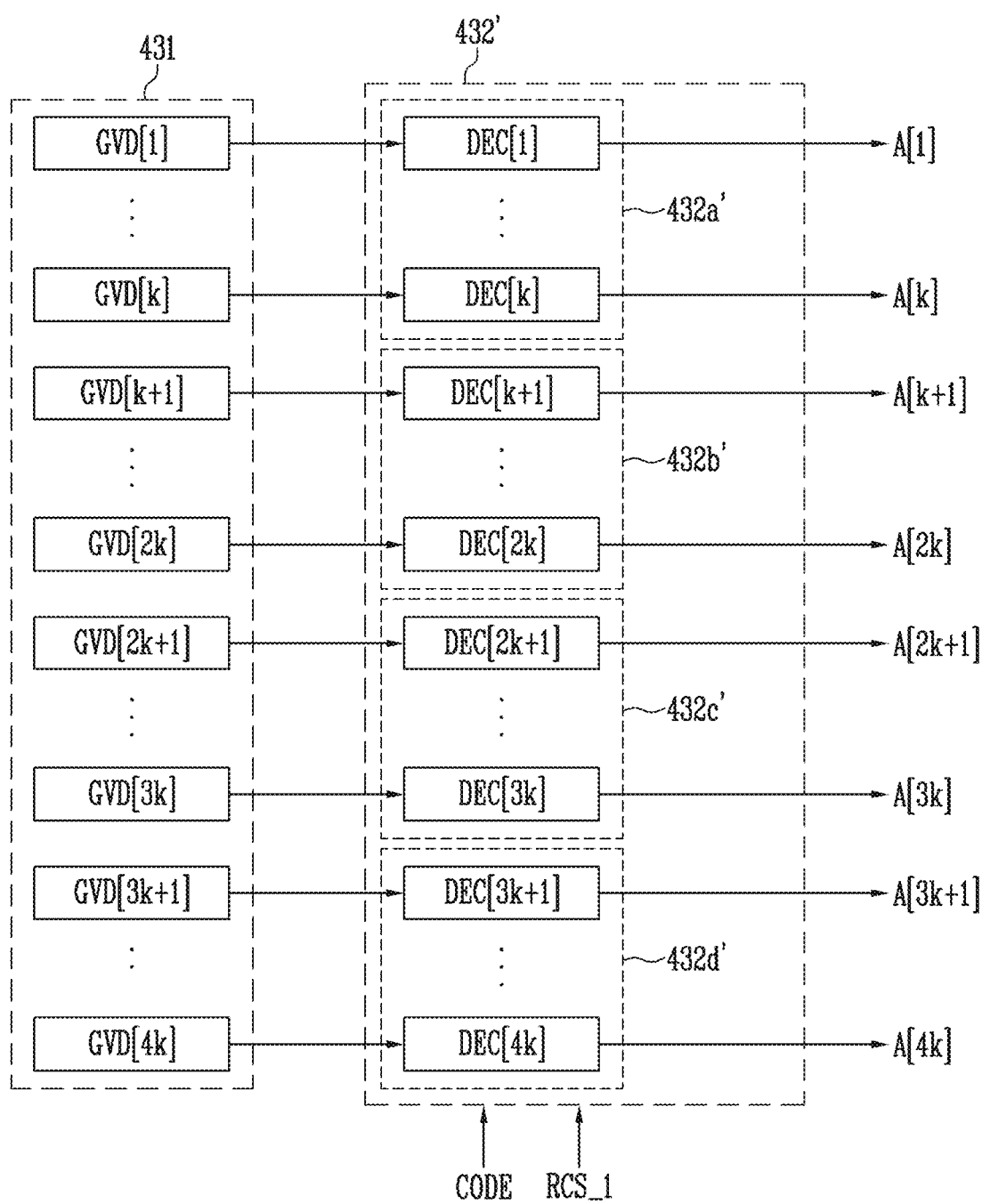
FIGS. 11 and 12 are diagrams for describing a digital-analog converter according to embodiments of the disclosure.
Figure 12:
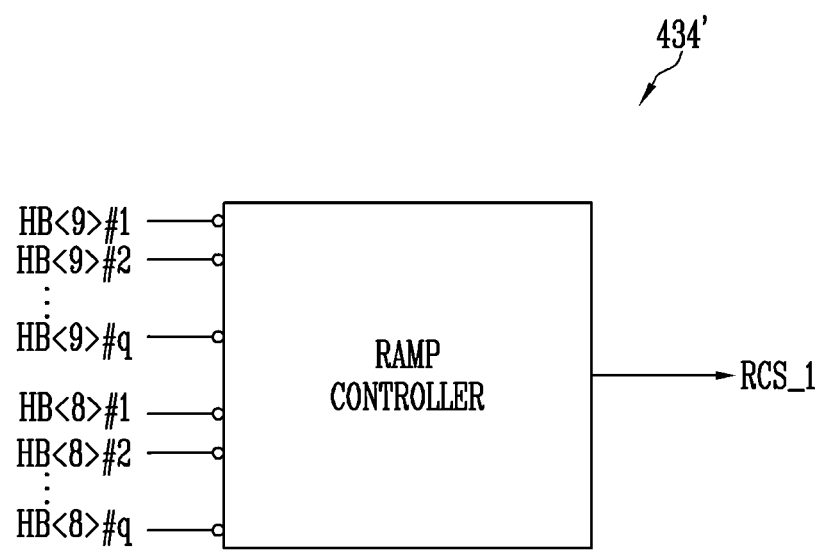

FIGS. 11 and 12 are diagrams for describing a digital-analog converter according to embodiments of the disclosure, and FIGS. 13A to 13D are diagrams for describing examples of an operation of the digital-analog converter according to FIGS. 11 and 12.

Referring to FIGS. 11 and 12, the digital-analog converter 430 according to FIGS. 11 and 12 is substantially the same as or similar to the digital-analog converter 430 according to FIGS. 5 to 9 except for a configuration in which a global ramp 432' of FIG. 11 is divided into first to fourth sub global ramps 432a', 432b', 432c', and 432d', and a ramp controller 434' of FIG. 12 further receives second most significant bits HB<8>#1 to HB<8>#q. Here, the second most significant bits are the higher bits HB<8>#1 to HB<8>#q of a bit position closest to the bit position of the most significant bit MSB. Therefore, repetitive description is omitted.

In an embodiment, the global ramp 432' may be divided into the first sub global ramp 432a' including k gamma decoders DEC[1] to DEC[k], the second sub global ramp 432b' including k gamma decoders DEC[k+1] to DEC[2k], the third sub global ramp 432c' including k gamma decoders DEC[2k+1] to DEC[3k], and the fourth sub global ramp 432d' including k gamma decoders DEC[3k+1] to DEC[4k]. In FIGS. 11 to 13D, it is assumed that 4k is 1024/16, that is, 64(=$2^6$).

In an embodiment, the global ramp 432' may turn off an operation of at least one of the first sub global ramp 432a', the second sub global ramp 432b', the third sub global ramp 432c', and the fourth sub global ramps 432d' based on a ramp control signal RCS_1.

The ramp controller 434' may generate the ramp control signal RCS_1, based on a comparison result of the most significant bit MSB of the image data DATA corresponding to each channel CH and a comparison result of the second most significant bits.

As shown in FIG. 12, the ramp controller 434' may generate the ramp control signal RCS_1 based on the most significant bits HB<9>#1 to HB<9>#q and the second most significant bits HB<8>#1 to HB<8>#q.

In an embodiment, the ramp controller 434' may generate the ramp control signal RCS_1 by comparing the most significant bits HB<9>#1 to HB<9>#q and comparing the second most significant bits HB<8>#1 to HB<8>#q. The ramp controller 434' may generate the ramp control signal RCS_1 by determining the gamma decoders to be turned off among the gamma decoders DEC[1] to DEC[4k] included in the global ramp 432', based on the comparison result for the most significant bits HB<9>#1 to HB<9>#q and the comparison result for the second most significant bits HB<8>#1 to HB<8>#q.

When all of the most significant bits HB<9>#1 to HB<9>#q are the same and all of the second most significant bits HB<8>#1 to HB<8>#q are the same, the ramp controller 434' may generate a ramp control signal RCS_1 for turning off remaining sub global ramps except for one of the first to fourth sub global ramps 432a', 432b', 432c', and 432d'.

Figure 13A:
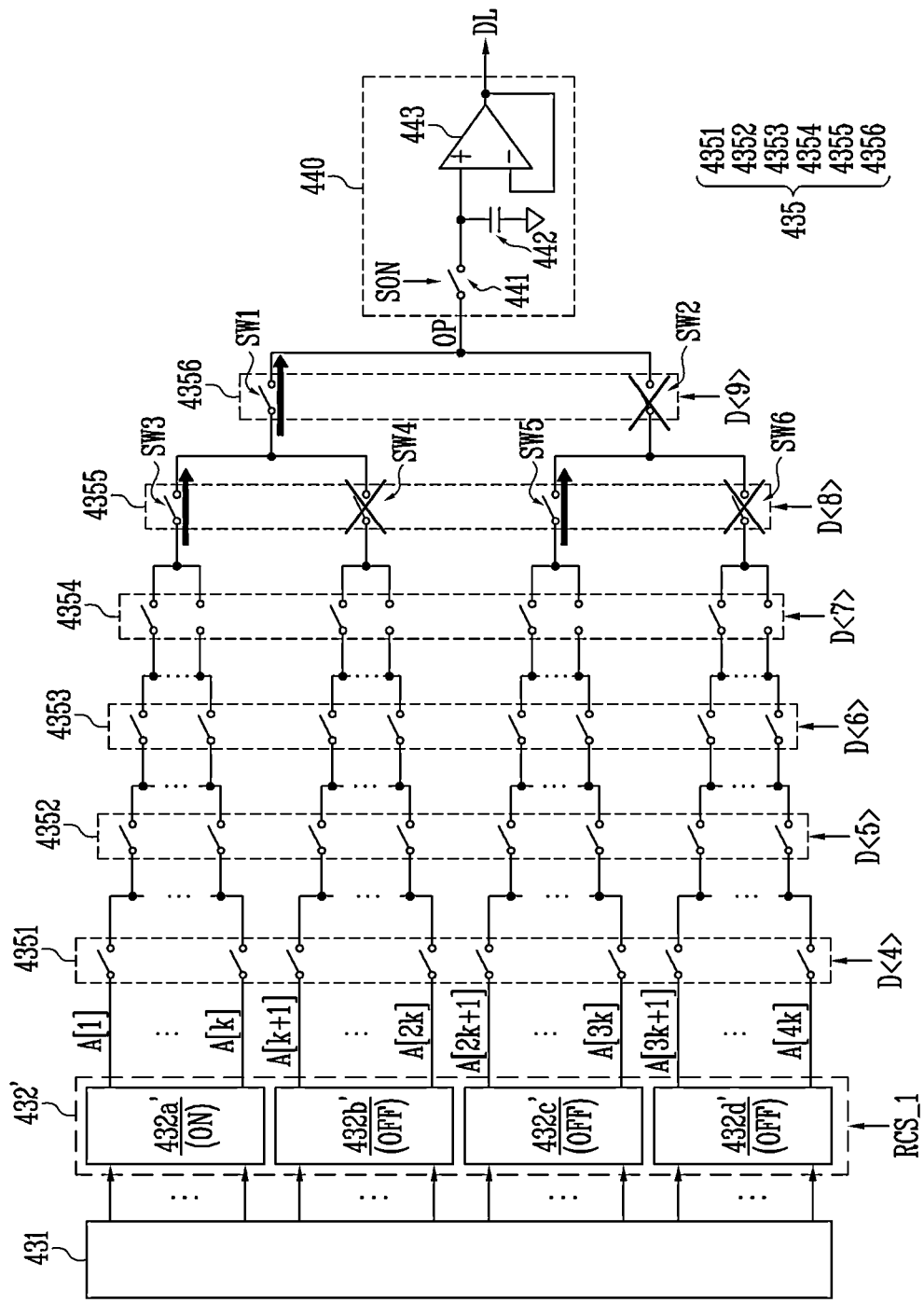
FIGS. 13A to 13D are diagrams for describing examples of an operation of the digital-analog converter according to FIGS. 11 and 12.
Figure 13B:
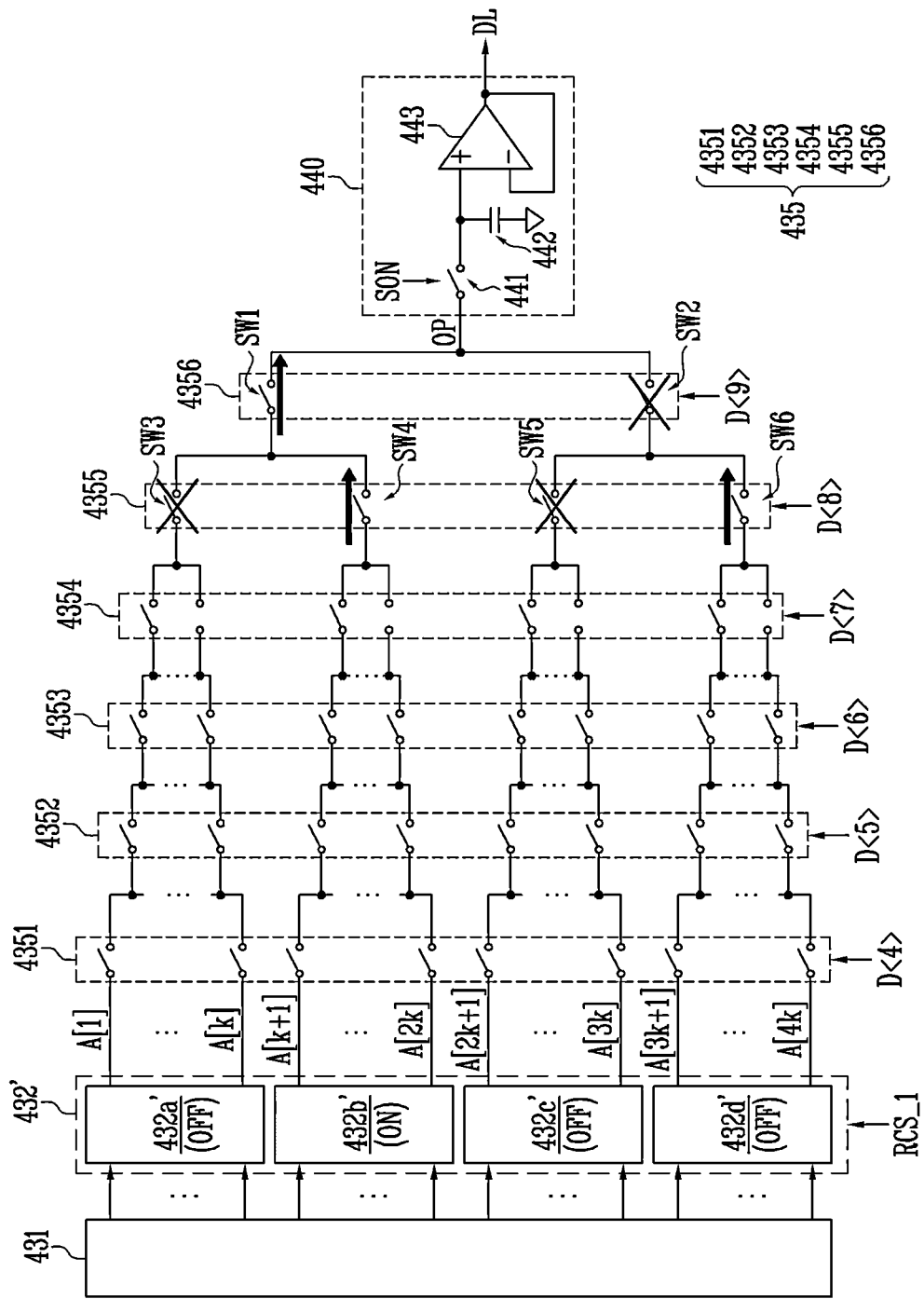
Figure 13C:
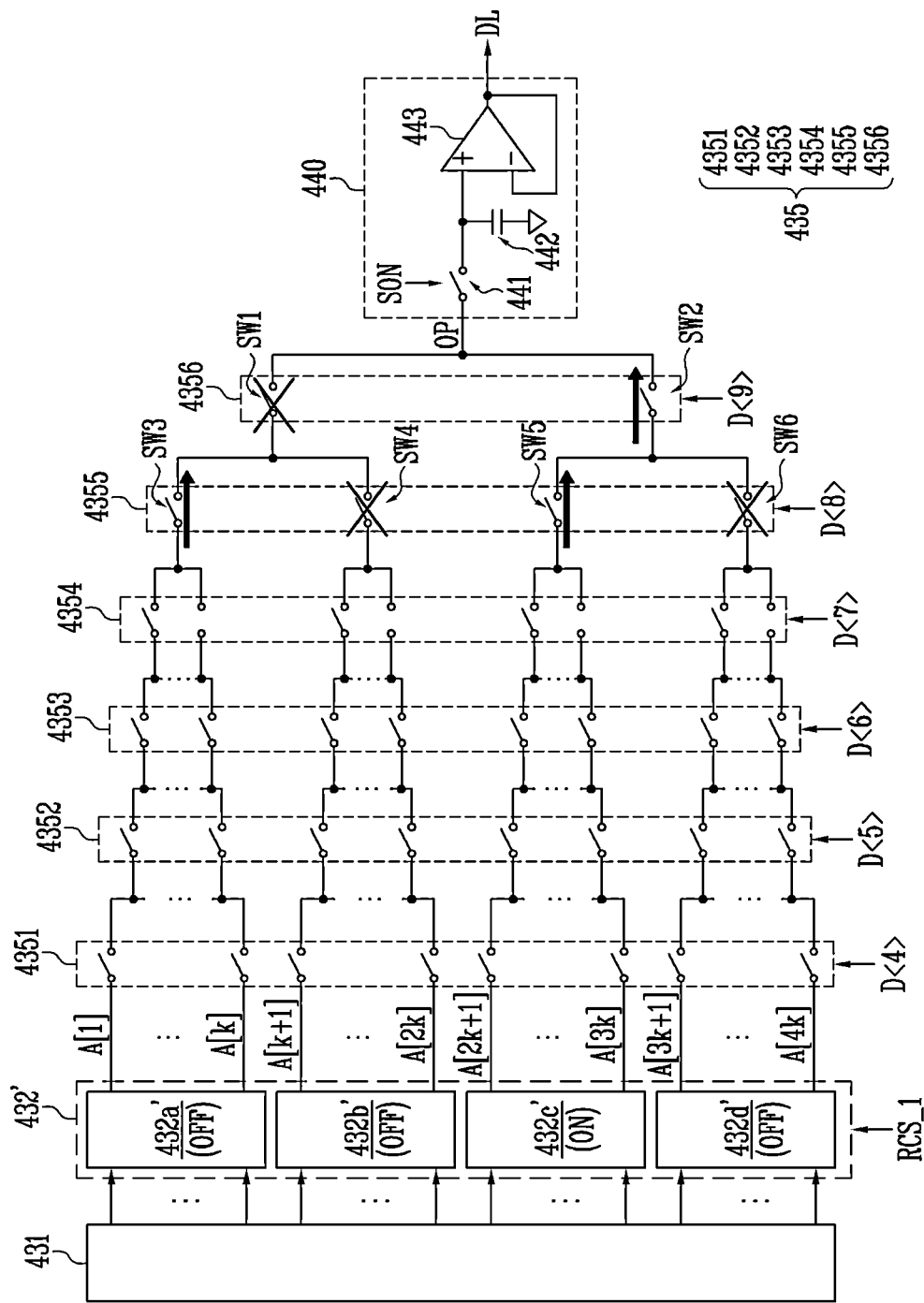
Figure 13D:
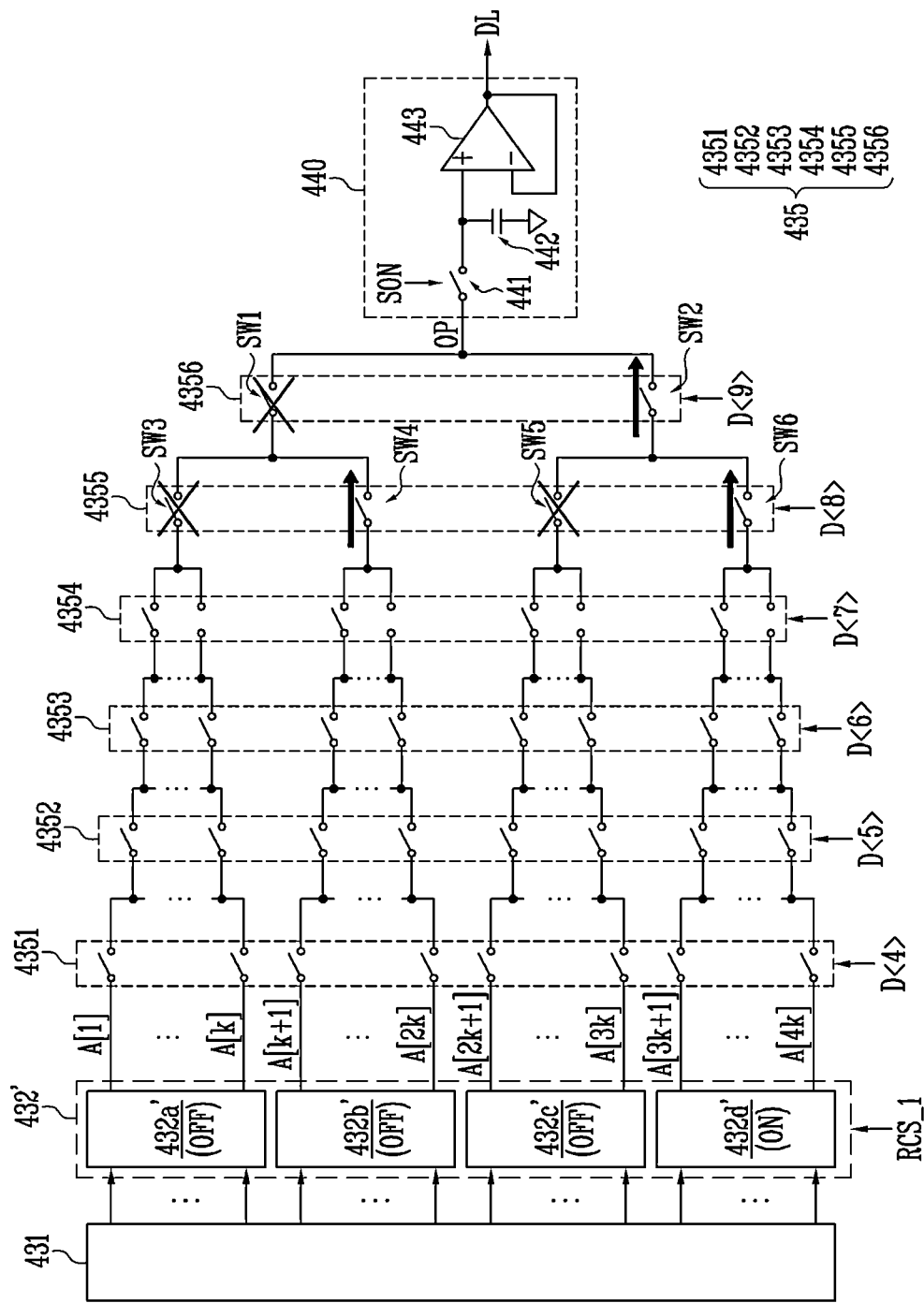

In an embodiment, when all of the most significant bits HB<9>#1 to HB<9>#q have a value of 1 and all of the second most significant bits HB<8>#1 to HB<8>#q have a value of 1, the ramp controller 434' may turn off the operation of the second to fourth sub global ramps 432b', 432c', and 432d' except for the first sub global ramp 432a' as shown in FIG. 13A. In addition, when all of the most significant bits HB<9>#1 to HB<9>#q have a value of 1 and all of the second most significant bits HB<8>#1 to HB<8>#q have a value of 0, the ramp controller 434' may turn off the operation of the first, third, and fourth sub global ramps 432a', 432c', and 432d' except for the second sub global ramp 432b' as shown in FIG. 13B. In addition, when all of the most significant bits HB<9>#1 to HB<9>#q have a value of 0 and all of the second most significant bits HB<8>#1 to HB<8>#q have a value of 1, the ramp controller 434' may turn off the operation of the first, second, and fourth sub global ramps 432a', 432b', and 432d' except for the third sub global ramp 432c' as shown in FIG. 13C. In addition, when all of the most significant bits HB<9>#1 to HB<9>#q have a value of 0 and all of the second most significant bits HB<8>#1 to HB<8>#q have a value of 0, the ramp controller 434' may turn off the operation of the first to third sub global ramps 432a', 432b', and 432c' except for the fourth sub global ramp 432d' as shown in FIG. 13D.

In an embodiment, for example, referring to FIG. 13A, when all of the most significant bits HB<9>#1 to HB<9>#q of the image data DATA corresponding to the channels CH have a value of 1, only the first switch SW1 of the switches SW1 and SW2 included in the selector 4356 corresponding to the most significant bits HB<9>#1 to HB<9>#q may be turned on in response to the input code D<9> having a value of 1. In this case, the second switch SW2 may maintain a turn-off state. In this case, since the second switch SW2 maintains the turn-off state, global gamma voltages A[2k+1] to A[4k] output by the third and fourth sub global ramps 432c' and 432d' are not output to the buffer 440.

In addition, when all of the second most significant bits HB<8>#1 to HB<8>#q of the image data DATA corresponding to the channels CH have a value of 1, only third and fifth switches SW3 and SW5 of switches SW3, SW4, SW5, and SW6 included in the selector 4355 corresponding to the second most significant bits HB<8>#1 to HB<8>#q may be turned on in response to the input code D<8> having a value of 1. In this case, the fourth and sixth switches SW4 and SW6 may maintain a turn-off state. In this case, since the fourth and sixth switches SW4 and SW6 maintain the turn-off state, the global gamma voltages [k+1] to A[2k] and A[3k+1] to A[4k] output by the second and fourth sub global ramps 432b' and 432d' are not output to the buffer 440.

In sum, the global gamma voltages A[k+1] to A[4k] output by the second to fourth sub global ramps 432b', 432c', and 432d' in a corresponding horizontal period are not output to the buffer 440.

Accordingly, in order to prevent unnecessary power consumption due to the operation of the second to fourth sub global ramps 432b', 432c', and 432d' in the corresponding horizontal period, the ramp controller 434' may generate the ramp control signal RCS_1 for turning off the operation of the second to fourth sub global ramps 432b', 432c', and 432d'. In this case, the global ramp 432 may turn off the operation of the second to fourth sub global ramps 432b', 432c', and 432d' based on the ramp control signal RCS_1 provided from the ramp controller 434'.

As another example, referring to FIG. 13B, when all of the most significant bits HB<9>#1 to HB<9>#q of the image data DATA corresponding to the channels CH have a value of 1 and all of the second most significant bits HB<8>#1 to HB<8>#q of the image data DATA corresponding to the channels CH have a value of 0, only the fourth and sixth switches SW4 and SW6 of the switches SW3, SW4, SW5, and SW6 included in the selector 4355 corresponding to the second most significant bits HB<8>#1 to HB<8>#q may be turned on in response to the input code D<8> having a value of 0. In this case, the third and fifth switches SW3 and SW5 may maintain a turn-off state. In this case, since the third and fifth switches SW3 and SW5 maintain the turn-off state, global gamma voltages A[1] to A[k] and A[2k+1] to A[3k] output by the first and third sub global ramps 432a' and 432c' are not output to the buffer 440.

In sum, the global gamma voltages A[1] to A[k] and A[2k+1] to A[4k] output by the first, third, and fourth sub global ramps 432a', 432c', and 432d' in the horizontal period are not output to the buffer 440.

Accordingly, in order to prevent unnecessary power consumption due to the operation of the first, third, and fourth sub global ramps 432a', 432c', and 432d' in the corresponding horizontal period, the ramp controller 434' may generate the ramp control signal RCS_1 for turning off the operation of the first, third, and fourth sub global ramps 432a', 432c', and 432d'. In this case, the global ramp 432 may turn off the operation of the first, third, and fourth sub global ramps 432a', 432c', and 432d' based on the ramp control signal RCS_1 provided from the ramp controller 434'.

As still another example, referring to FIG. 13C, when all of the most significant bits HB<9>#1 to HB<9>#q of the image data DATA corresponding to the channels CH have a value of 0, only the second switch SW2 of the switches SW1 and SW2 included in the selector 4356 corresponding to the most significant bits HB<9>#1 to HB<9>#q may be turned on in response to the input code D<9> having a value of 0. In this case, the first switch SW1 may maintain a turn-off state. In this case, since the first switch SW1 maintains the turn-off state, the global gamma voltages A[1] to A[2k] output by the first and second sub global ramps 432a' and 432b' are not output to the buffer 440.

In addition, when all of the second most significant bits HB<8>#1 to HB<8>#q of the image data DATA corresponding to the channels CH have a value of 1, the third and fifth switches SW3 and SW5 among the switches SW3, SW4, SW5, and SW6 included in the selector 4355 corresponding to the second most significant bits HB<8>#1 to HB<8>#q may be turned on in response to the input code D<8> having a value of 1. In this case, the fourth and sixth switches SW4 and SW6 may maintain a turn-off state. In this case, since the fourth and sixth switches SW4 and SW6 maintain the turn-off state, the global gamma voltages [k+1] to A[2k] and A[3k+1] to A[4k] output by the second and fourth sub global ramps 432b' and 432d' are not output to the buffer 440.

In sum, the global gamma voltages A[1] to A[2k] A[3k+1] to A[4k] output by the first, second, and fourth sub global ramps 432a', 432b', and 432d' in the corresponding horizontal period are not output to the buffer 440.

Accordingly, in order to prevent unnecessary power consumption due to the operation of the first, second, and fourth sub global ramps 432a', 432b', and 432d' in the corresponding horizontal period, the ramp controller 434' may generate the ramp control signal RCS_1 for turning off the operation of the first, second, and fourth sub global ramps 432a', 432b', and 432d'. In this case, the global ramp 432 may turn off the operation of the first, second, and fourth sub global ramps 432a', 432b', and 432d' based on the ramp control signal RCS_1 provided from the ramp controller 434'.

As still another example, referring to FIG. 13D, when all of the most significant bits HB<9>#1 to HB<9>#q of the image data DATA corresponding to the channels CH have a value of 0 and all of the second most significant bits HB<8>#1 to HB<8>#q of the image data DATA corresponding to the channels CH have a value of 0, the fourth and sixth switches SW4 and SW6 among the switches SW3, SW4, SW5, and SW6 included in the selector 4355 corresponding to the second most significant bits HB<8>#1 to HB<8>#q may be turned on in response to the input code D<8> having a value of 0. In this case, the third and fifth switches SW3 and SW5 may maintain a turn-off state. In this case, since the third and fifth switches SW3 and SW5 maintain the turn-off state, the global gamma voltages A[1] to A[k] and A[2k+1] to A[3k] output by the first and third sub global ramps 432a' and 432c' are not output to the buffer 440.

In sum, the global gamma voltages A[1] to A[3k] output by the first to third sub global ramps 432a', 432b', and 432c' in the corresponding horizontal period are not output to the buffer 440.

Accordingly, in order to prevent unnecessary power consumption due to the operation of the first to third sub global ramps 432a', 432b', and 432c' in the corresponding horizontal period, the ramp controller 434' may generate the ramp control signal RCS_1 for turning off the operation of the first to third sub global ramps 432a', 432b', and 432c'. In this case, the global ramp 432 may turn off the operation of the first to third sub global ramps 432a', 432b', and 432c' based on the ramp control signal RCS_1 provided from the ramp controller 434'.

Figure 14:
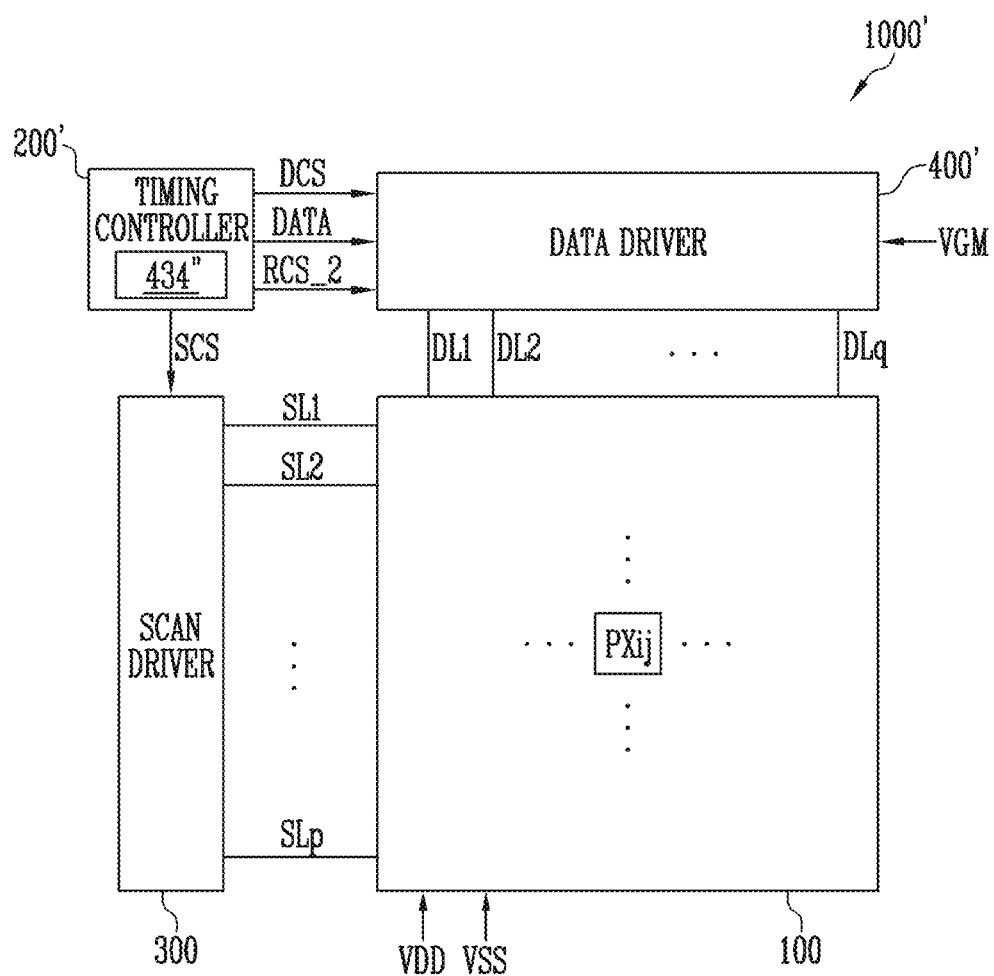
FIG. 14 is a block diagram illustrating a display device according to embodiments of the disclosure.

FIG. 14 is a block diagram illustrating a display device according to embodiments of the disclosure.

Referring to FIGS. 1 and 14, the display device 1000' of FIG. 14 is substantially the same or similar to the display device 1000 of FIG. 1 except for a configuration in which a timing controller 200' includes a ramp controller 434" and the ramp controller 434" generates a ramp control signal RCS_2 by comparing the most significant bits of image data (the image data DATA of FIG. 3) and provides the ramp control signal RCS_2 to a data driving circuit 400'. Therefore, repetitive description is omitted.

The foregoing detailed description illustrates and describes the disclosure. In addition, the foregoing description merely shows and describes preferred embodiments of the disclosure, and as described above, the disclosure may be used in various other combinations, modifications, and environments, and the disclosure may be changed or modified within the scope of the concept of the disclosure disclosed in this specification, the scope equivalent to the disclosed disclosure, and/or the skill or knowledge in the art.

Accordingly, the detailed description of the disclosure is not intended to limit the disclosure to the disclosed embodiments. Also, the appended claims should be construed as including other embodiments.

What is claimed is:
1. A digital-analog converter for converting digital image data to generate analog data signals, comprising:
 a voltage divider which generates a plurality of gamma reference voltages based on a first reference voltage and a second reference voltage;
 a global ramp including a plurality of gamma decoders which generates a plurality of global gamma voltages based on the gamma reference voltages;
 a decoder which selects one of the global gamma voltages according to the digital image data to generate the analog data signals; and
 a ramp controller which turns off at least some of the gamma decoders based on the digital image data while any remaining gamma decoders of the plurality of gamma decoders not turned off remain turned on.

2. The digital-analog converter according to claim 1, wherein the ramp controller generates a ramp control signal by comparing most significant bits of the digital image data, and
wherein the at least some of the gamma decoders are turned off based on the ramp control signal.

3. The digital-analog converter according to claim 2, wherein the ramp controller turns off the at least some of the gamma decoders when all of the most significant bits are the same during one horizontal period.

4. The digital-analog converter according to claim 3, wherein the ramp controller turns off gamma decoders among the gamma decoders except for gamma decoders that generate global gamma voltages corresponding to a value of the most significant bits among the plurality of global gamma voltages.

5. The digital-analog converter according to claim 1, wherein the ramp controller generates a ramp control signal by comparing most significant bits of the digital image data and second most significant bits of the digital image data, and
wherein the at least some of the gamma decoders are turned off based on the ramp control signal.

6. The digital-analog converter according to claim 5, wherein the ramp controller turns off the at least some of the gamma decoders when all of the most significant bits are the same and all of the second most significant bits are the same.

7. The digital-analog converter according to claim 6, wherein the ramp controller turns off gamma decoders among the gamma decoders except for gamma decoders that generate global gamma voltages corresponding to a value of the most significant bits and a value of the second most significant bits among the plurality of global gamma voltages.

8. The digital-analog converter according to claim 1, wherein the voltage divider includes a plurality of resistors connected in series between a supplier of the first reference voltage and a supplier of the second reference voltage, and generates the gamma reference voltages based on voltages divided between the first reference voltage and the second reference voltage.

9. The digital-analog converter according to claim 1, wherein the digital image data are h bits, include higher bits of n bits and lower bits of m bits, and the h corresponds to a sum of the m and the n.

10. The digital-analog converter according to claim 9, further comprising:
a code generator which generates a digital code corresponding to the lower bits of the digital image data,
wherein the global ramp generates the global gamma voltages in response to the digital code.

11. The digital-analog converter according to claim 9, wherein the decoder generates the analog data signals in response to an input code corresponding to the higher bits of the digital image data.

12. The digital-analog converter according to claim 1, wherein the second reference voltage is a ground voltage.

13. A data driving circuit comprising:
a digital-analog converter which converts digital image data to generate analog data signals; and
a buffer which outputs data voltages to data lines based on the analog data signals, wherein the digital-analog converter comprises:
a voltage divider which generates a plurality of gamma reference voltages based on a first reference voltage and a second reference voltage;
a global ramp including a plurality of gamma decoders which generates a plurality of global gamma voltages based on the gamma reference voltages;
a decoder which selects one of the global gamma voltages according to the digital image data to generate the analog data signals; and
a ramp controller which turns off at least some of the gamma decoders based on the digital image data while any remaining gamma decoders of the plurality of gamma decoders not turned off remain turned on.

14. The data driving circuit according to claim 13, wherein the ramp controller generates a ramp control signal by comparing most significant bits of the digital image data corresponding to the data lines, respectively, and
wherein the at least some of the gamma decoders are turned off based on the ramp control signal.

15. The data driving circuit according to claim 14, wherein the ramp controller turns off gamma decoders among the gamma decoders except for gamma decoders that generate global gamma voltages corresponding to a value of the most significant bits among the plurality of global gamma voltages, when all of the most significant bits are the same.

16. The data driving circuit according to claim 13, wherein the ramp controller generates a ramp control signal by comparing most significant bits of the digital image data corresponding to the data lines, respectively, and comparing second most significant bits of the digital image data, and
wherein the at least some of the gamma decoders are turned off based on the ramp control signal.

17. The data driving circuit according to claim 16, wherein the ramp controller turns off gamma decoders among the gamma decoders except for gamma decoders that generate global gamma voltages corresponding to a value of the most significant bits and a value of the second most significant bits among the plurality of global gamma voltages, when all of the most significant bits are the same and all of the second most significant bits are the same.

18. A display device comprising:
a display panel including a plurality of pixels;
a data driving circuit which provides data signals to the pixels through data lines; and
a timing controller which provides image data to the data driving circuit,
wherein the data driving circuit comprises:
a digital-analog converter which converts the image data of a digital format to generate analog data signals of an analog format; and
a buffer which outputs the data signals to the data lines,
wherein the digital-analog converter comprises:
a voltage divider which generates a plurality of gamma reference voltages based on a first reference voltage and a second reference voltage;
a global ramp including a plurality of gamma decoders which generates a plurality of global gamma voltages based on the gamma reference voltages; and
a decoder which selects one of the global gamma voltages according to the image data to generate the analog data signals,
wherein the timing controller turns off at least some of the gamma decoders based on the image data while any gamma decoders of the plurality of gamma decoders not turned off remain turned on.

19. The display device according to claim 18, wherein the timing controller comprises a ramp controller which generates a ramp control signal by comparing most significant bits of the image data corresponding to the data lines, respectively, and wherein the at least some of the gamma decoders are turned off based on the ramp control signal.

20. The display device according to claim 18, wherein the timing controller comprises a ramp controller which generates a ramp control signal by comparing most significant bits of the image data corresponding to the data lines, respectively, and comparing second most significant bits of the digital image data, and wherein the at least some of the gamma decoders are turned off based on the ramp control signal.

\* \* \* \* \*